United States Patent
Saitoh et al.

(10) Patent No.: US 9,035,315 B2
(45) Date of Patent: May 19, 2015

(54) SEMICONDUCTOR DEVICE, DISPLAY DEVICE, AND METHOD FOR MANUFACTURING SEMICONDUCTOR DEVICE

(75) Inventors: Hajime Saitoh, Osaka (JP); Naoki Makita, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 361 days.

(21) Appl. No.: 13/695,217

(22) PCT Filed: Feb. 10, 2011

(86) PCT No.: PCT/JP2011/052845
§ 371 (c)(1),
(2), (4) Date: Oct. 30, 2012

(87) PCT Pub. No.: WO2011/135890
PCT Pub. Date: Nov. 3, 2011

(65) Prior Publication Data
US 2013/0063329 A1   Mar. 14, 2013

(30) Foreign Application Priority Data
Apr. 30, 2010 (JP) ................................. 2010-105643

(51) Int. Cl.
*H01L 27/12* (2006.01)
*H01L 27/11* (2006.01)

(52) U.S. Cl.
CPC ............ *H01L 27/1222* (2013.01); *H01L 27/11* (2013.01); *H01L 27/1108* (2013.01); *H01L 27/1214* (2013.01)

(58) Field of Classification Search
CPC .................................................. H01L 27/1222
See application file for complete search history.

(56) References Cited

U.S. PATENT DOCUMENTS

| 2002/0098635 A1 | 7/2002 | Zhang et al. |
| 2003/0160245 A1 | 8/2003 | Kurosawa |

(Continued)

FOREIGN PATENT DOCUMENTS

| JP | 2000-196096 A | 7/2000 |
| JP | 2002-343976 A | 11/2002 |

(Continued)

OTHER PUBLICATIONS

U.S. Appl. No. 13/703,987, filed Dec. 13, 2012.

*Primary Examiner* — Matthew W Such
*Assistant Examiner* — Ali Naraghi
(74) *Attorney, Agent, or Firm* — Chen Yoshimura LLP

(57) ABSTRACT

A purpose of the present invention is to reduce the driving voltage of a semiconductor device that includes an n-type TFT and a p-type TFT. Disclosed is a semiconductor device in which an n-channel type first thin film transistor (100) and a p-channel type second thin film transistor (200) are provided on the plane of a substrate (1). A first semiconductor layer (11) of the first thin film transistor (100) has a main portion, which is sandwiched between the upper surface and the lower surface of the first semiconductor layer (11), and an slanted portion, which is sandwiched by the side face and the lower surface of the first semiconductor layer (11). A second semiconductor layer (20) has a main portion, which is sandwiched between the upper surface and the lower surface of the second semiconductor layer (20), and a slanted portion, which is sandwiched between the side face and the lower surface of the second semiconductor layer (20). The inclination angle of the side face of the second semiconductor layer (20) relative to the plane of the substrate (1) is larger than the inclination angle of the side face of the first semiconductor layer (11) relative to the plane of the substrate (1).

19 Claims, 21 Drawing Sheets

(56) References Cited

U.S. PATENT DOCUMENTS

| | | | |
|---|---|---|---|
| 2003/0183857 A1* | 10/2003 | Korenari | 257/288 |
| 2005/0285111 A1* | 12/2005 | Tsuboi | 257/66 |
| 2007/0194377 A1* | 8/2007 | Sera et al. | 257/338 |
| 2007/0272989 A1* | 11/2007 | Suzawa et al. | 257/408 |
| 2010/0006852 A1* | 1/2010 | Park et al. | 257/72 |
| 2010/0200862 A1* | 8/2010 | Yang et al. | 257/72 |
| 2012/0025320 A1* | 2/2012 | Chen et al. | 257/369 |

FOREIGN PATENT DOCUMENTS

| | | |
|---|---|---|
| JP | 2003-258262 A | 9/2003 |
| WO | 2011/096387 A1 | 8/2011 |
| WO | 2011/158780 A1 | 12/2011 |

* cited by examiner (a)

(b)

(a)

(b)

(a)

(b)

(a)

(b)

(a)

(b)

(a)

(b)

(c)

(d)

(e)

(f)

(g)

(h)

(a)

(b)  (c)

(d)

(a)

(b)

(a)

(b)

(a)

(b)

(a)

(b)

(a)

(b)

(a)

(b)

(c)

(d)

(e)

(f)

(g)

(a)

(b)

(c)

(d)

(a)

(b)

(a)

(b)

(a)

(b)

SEMICONDUCTOR DEVICE, DISPLAY DEVICE, AND METHOD FOR MANUFACTURING SEMICONDUCTOR DEVICE

TECHNICAL FIELD

The present invention relates to a semiconductor device and a display device provided with thin film transistors (TFTs), and to a method of manufacturing a semiconductor device.

BACKGROUND ART

A semiconductor device having p-channel type and n-channel type thin film transistors (TFTs) formed on the same substrate, and an electronic device equipped with such a semiconductor device have been developed.

In an active matrix liquid crystal display device or an organic EL display device, for example, a technique for integrally forming a driver circuit on an active matrix substrate has been proposed. A typical driver circuit uses a CMOS (Complementary Metal Oxide Semiconductor) that includes a p-channel type TFT (abbreviated to "p-type TFT" below) and an n-channel type TFT (abbreviated to "n-type TFT" below). In order to prevent an occurrence of a leak current in the configuration using the CMOS, driving voltages of the respective TFTs need to be adjusted such that the two types of TFTs, which constitute the CMOS, are both turned off when the gate voltage is not applied. Also, from the perspective of reducing power consumption, the driving voltages of the TFTs need to be minimized.

Patent Document 1 discloses a technique for providing a memory circuit in each pixel on the active matrix substrate in an active matrix liquid crystal display device or an organic EL display device. With this configuration, image data of each pixel can be stored in the memory circuit (referred to as "image memory" below) provided in the pixel, which makes it possible to continuously display a still image without receiving a supply of image data from the outside, thereby reducing the power consumption for image display. Patent Document 2 discloses a technique for preventing an occurrence of a parasitic TFT in a TFT that has a slanted portion (tapered portion) at edges of the active layer.

In terms of the image memory, the use of a DRAM (Dynamic Random Access Memory) or an SRAM (Static Random Access Memory) has been proposed. Between the two, the SRAM is able to operate faster than the DRAM, and because there is no need to perform a refresh operation, which is required in the DRAM, the power consumption can be reduced. The SRAM has a flip-flop circuit that uses a plurality of TFTs including p-type and n-type TFTs. Even if a display device is provided with such image memories, a further reduction in driving voltages may be needed, depending on applications in which the display device is used.

RELATED ART DOCUMENTS

Patent Documents

Patent Document 1: Japanese Patent Application Laid-Open Publication No. 2003-258262
Patent Document 2: Japanese Patent Application Laid-Open Publication No. 2002-343976

SUMMARY OF THE INVENTION

Problems to be Solved by the Invention

In order to further reduce a driving voltage in a display device, a semiconductor device, or the like, which is equipped with both the p-type and n-type TFTs as described above, it is necessary to minimize respective threshold voltages Vth of the p-type TFT and the n-type TFT. The value of the threshold voltage Vth is set such that the TFT is turned off when the gate voltage is zero (Vg=0V) (i.e., normally off), but between the p-type TFT and the n-type TFT, the respective voltage-current characteristics (Vg-Id characteristics) differ. Also, a typical semiconductor layer in a TFT, which is made of a silicon (Si) film or the like, is patterned to have a planarized portion and a slanted portion (tapered portion) on the periphery thereof. The voltage-current characteristics of the n-type TFT and the p-type TFT in which the respective semiconductor layers have planarized portions and the slanted portions are represented by a curve that is obtained by combining the current-voltage curve of the planarized portion and the current-voltage curve of the slanted portion.

FIG. 20(a) is a graph showing an example of the voltage-current characteristics of the n-type TFT in which a semiconductor layer has a planarized portion and a slanted portion. FIG. 20(b) is a graph showing an example of the voltage-current characteristics of the p-type TFT in which a semiconductor layer has a planarized portion and a slanted portion. These characteristics are indicated by the solid lines (IVn(1) and IVp(1)) in the respective graphs. The dashed lines (IVn(2) and IVp(2)) in the respective graphs represent the voltage-current characteristics of the case in which the semiconductor layer does not have the slanted portion (or the case in which the effects of the slanted portion are excluded).

As shown in FIGS. 20(a) and 20(b), in both the n-type TFT and the p-type TFT, the current-voltage characteristics (IVn(1) and IVp(1)) near the gate voltage of 0V in the case where the semiconductor layer has the planarized portion and the slanted portion are shifted to the lower voltage side (negative side), as compared with the current-voltage characteristics (IVn(2) and IVp(2)) in the case where the slanted portion is not provided. As a result, in the n-type TFT, the drain current Id changes in two steps when driving up with an increase in the gate voltage, in other words, a so-called "hump" appears.

This phenomenon presumably occurs due to a parasitic transistor that results from the slanted portion of the semiconductor layer. Although the definite cause of the parasitic transistor is unknown, damage to the slanted portion of the semiconductor layer, which may be done during an etching step or an ashing step for the semiconductor layer, appears to be a possible cause, based on the results of the study conducted by the inventors of the present invention and the like.

Because of this, the source-drain voltage (Tn1) at the gate voltage of 0V in the n-type TFT in which the semiconductor layer has the planarized portion and the slanted portion becomes higher than the source-drain voltage (Tn2) at the gate voltage of 0V in the n-type TFT that is not provided with the slanted portion. Therefore, in the n-type TFT having the planarized portion and the slanted portion, the threshold voltage Vth needs to be set higher.

On the other hand, in the p-type TFT, the source-drain voltage (Tp1) at the gate voltage of 0V in the case where the semiconductor layer has the planarized portion and the slanted portion becomes lower than the source-drain voltage (Tp2) at the gate voltage of 0V in the p-type TFT that is not provided with the slanted portion. Thus, the problem that occurs in the n-type TFT does not arise.

In the n-type TFT, when a p-type impurity is doped (channel-doped) into the semiconductor layer thereof, for example, the current-voltage curve of the n-type TFT can be shifted to the higher voltage side. Patent Document 1 discloses a technique of doping a p-type impurity into the slanted portion at a higher concentration than that in the planarized portion in the semiconductor layer of the n-type TFT. This makes it possible to move the current-voltage curve of the parasitic transistor of the slanted portion so as to be masked by the current-voltage curve of the planarized portion.

FIGS. 21(a) and 21(b) respectively show cross-sectional views for explaining a method of manufacturing the n-type TFT and the p-type TFT disclosed in Patent Document 1. Below, with reference to FIG. 21, the method disclosed in Patent Document 1 will be explained.

First, on a substrate 241, a base insulating film 242 is formed, and thereafter, a semiconductor film doped with a p-type impurity (boron) is formed. Next, on the semiconductor film, a mask film made of a silicon oxide film, for example, is formed.

Next, in an n-type TFT forming region and a p-type TFT forming region on the substrate 241, resist films that cover parts of the mask film are respectively formed.

Thereafter, using the resist films as masks, the semiconductor film and the mask film are etched into island shaped layers. This way, island-shaped semiconductor layer 243n and mask layer 244n are formed in the n-type TFT forming region, and island-shaped semiconductor layer 243p and mask layer 244p are formed in the p-type TFT forming region. In this etching, the edge portions of the resist films in the respective TFT forming regions gradually recede. Along with this, portions of the semiconductor films that are protruding from the resist films and the mask layers 244n and 244p are etched so as to be thinner as they go further from the edge portions of the mask layers 244n and 244p. As a result, slanted portions are formed in the peripheries of the semiconductor layers 243n and 243p.

As shown in FIGS. 21(a) and 21(b), after removing the resist films, a resist film R4 is formed to cover the semiconductor layer 243p in the p-type TFT forming region, but not to cover the semiconductor layer 243n in the n-type TFT forming region.

Next, a p-type impurity that is set so as to pass through the mask layer 244n is implanted into the entire semiconductor layer 243n. Subsequently, a p-type impurity that is set so as not to pass through the mask layer 244n is selectively implanted into a portion (slanted portion) of the semiconductor layer 243n, which is not covered by the mask layer 244n. This way, the slanted portion of the semiconductor layer 243n is doped with twice to five times as much p-type impurity as the planarized portion in volume density. This makes it possible to suppress the effect of the parasitic transistor of the slanted portion of the semiconductor layer 243n in the n-type TFT.

Next, the resist film R4 is removed, and thereafter, an insulating film and a gate electrode (not shown) are formed on the mask layers 244n and 244p. The mask layers 244n and 244p and the insulating film are used as a gate insulating film.

In the conventional method shown in FIG. 21, the gate insulating film formed on portions (planarized portions) other than the slanted portions of the semiconductor layers 243n and 243p is made of two layers of the mask layers 244n and 244p and the insulating film formed thereon. On the other hand, because the mask layers are not formed on the slanted portions of the semiconductor layers 243n and 243p, the gate insulating film formed thereon is made of a single layer. This causes the breakdown voltage in the slanted portions of the semiconductor layers 243n and 243p to be lower than that in the planarized portions.

Also, in order to minimize the threshold voltage Vth of the TFT, it is necessary not only to suppress the effect of the parasitic transistor, but also to reduce the thickness of the gate insulating film, however, with the above-mentioned method, the gate insulating film is made of two layers, and therefore, it is not possible to sufficiently reduce the thickness thereof. If the mask layers 244n and 244p are removed, instead of being used as the gate insulating film, the thickness of the gate insulating film could be reduced, but it would create a need for a removal step of the mask layers 244n and 244p, in addition to the forming step thereof, thereby increasing the number of process steps. Also, in removing the mask layers 244n and 244p, the base insulating film 242, which is made of the same silicon oxide film as the mask layers 244n and 244p, is etched. As a result, a step is created in the base insulating film 242 at the edge portions of the semiconductor layers 243n and 243p, and therefore, defects such as disconnections of gate wiring become more likely to occur.

Further, because the p-type TFT forming region needs to be covered by the resist film R4 when implanting the p-type impurity into the slanted portion of the n-type TFT, the resist film R4 that has a large area is exposed to the impurity doping at a higher concentration than normal, which may result in a change in the property of the resist film R4. When the property of the resist film R4 is changed, it becomes difficult to remove the resist film R4 by plasma ashing, and the residual resist that was not removed causes a problem such as defects in TFT characteristics or contamination of the apparatus used for forming the semiconductor device.

The present invention was made in view of the above-mentioned problems, and aims at providing a semiconductor device or a display device equipped with an n-type TFT and a p-type TFT that are highly-reliable and that have low threshold voltages with high manufacturing efficiency.

Means for Solving the Problems

A semiconductor device of the present invention has a first thin film transistor of n-channel type and a second thin film transistor of p-channel type on a face of a single substrate, wherein the first thin film transistor includes: a first semiconductor layer that has a first channel region, a first source region, and a first drain region; a first gate electrode disposed above the first channel region; and a gate insulating film disposed between the first semiconductor layer and the first gate electrode, wherein the second thin film transistor includes: a second semiconductor layer that has a second channel region, a second source region, and a second drain region; a second gate electrode disposed above the second channel region; and a gate insulating film disposed between the second semiconductor layer and the second gate electrode, wherein the first semiconductor layer has a main portion that is sandwiched by a upper surface and a lower surface of the first semiconductor layer and a slanted portion that is sandwiched by a side face and the lower surface of the first semiconductor layer, wherein the second semiconductor layer has a main portion that is sandwiched by a upper surface and a lower surface of the second semiconductor layer and a slanted portion that is sandwiched by a side face and the lower surface of the second semiconductor layer, and wherein an inclination angle of the side face of the second semiconductor layer relative to a plane of the substrate is larger than an inclination angle of the side face of the first semiconductor layer.

In one embodiment, the inclination angle of the side face of the first semiconductor layer is 30° or greater and 45° or smaller.

In one embodiment, the inclination angle of the side face of the second semiconductor layer is 45° or greater and 60° or smaller.

In one embodiment, a volume of the slanted portion of the first semiconductor layer is larger than a volume of the slanted portion of the second semiconductor layer.

In one embodiment, the slanted portion of the first semiconductor layer is doped with a p-type impurity.

In one embodiment, the first and second semiconductor layers are obtained by patterning the same semiconductor film.

In one embodiment, when viewed from the normal direction to the plane of the substrate, the slanted portion of the first semiconductor layer is extended in the same direction as a direction in which the first channel region is extended, and the slanted portion of the second semiconductor layer is extended in the same direction as a direction in which the second channel region is extended.

In one embodiment, a mask film is formed between the main portion of the first semiconductor layer and the first gate electrode, and a mask film is formed between the main portion of the second semiconductor layer and the second gate electrode.

In one embodiment, when viewed from the normal direction to the plane of the substrate, the first semiconductor layer has a first neck portion located between the first source region and the first drain region, and the second semiconductor layer has a second neck portion located between the second source region and the second drain region. The slanted portion of the first semiconductor layer is included in the first neck portion, and the slanted portion of the second semiconductor layer is included in the second neck portion.

In one embodiment, the semiconductor device includes an SRAM circuit, and the SRAM circuit has the first thin film transistor and the second thin film transistor.

A display device according to the present invention includes a plurality of pixels, each of which is provided with a pixel electrode and a memory circuit that is connected to the pixel electrode and that stores an image signal, and the memory circuit includes the SRAM circuit.

A method of manufacturing a semiconductor device according to the present invention is a method of manufacturing a semiconductor device that has a first thin film transistor of n-channel type and a second thin film transistor of p-channel type on a face of a single substrate, the method including: (a) forming a semiconductor film on the substrate; (b) forming a first semiconductor layer that becomes an active region of the first thin film transistor by etching the semiconductor film using a first mask film as a mask, the first semiconductor layer including a main portion that is covered by the first mask film and a slanted portion that is located in a periphery of the first semiconductor layer and that is not covered by the first mask film; (c) forming a second semiconductor layer that becomes an active region of the second thin film transistor by etching the semiconductor film using a second mask film as a mask, the second semiconductor layer including a main portion that is covered by the second mask film and a slanted portion that is located in a periphery of the second semiconductor layer and that is not covered by the second mask film; and (d) covering each of the main portions of the first semiconductor layer and the second semiconductor layer with a mask, and implanting a p-type impurity selectively into the slanted portion of the first semiconductor layer and the slanted portion of the second semiconductor layer, wherein an inclination angle of a side face of the slanted portion of the second semiconductor layer, which is formed in the step (c), relative to a plane of the substrate is larger than an inclination angle of a side face of the slanted portion of the first semiconductor layer, which is formed in the step (b).

In one embodiment, the inclination angle of the side face of the first semiconductor layer, which is formed in the step (b), is 30° or greater and 45° or smaller.

In one embodiment, the inclination angle of the side face of the second semiconductor layer, which is formed in the step (c), is 45° or greater and 60° or smaller.

In one embodiment, a volume of the slanted portion of the first semiconductor layer, which is formed in the step (b), is larger than a volume of the slanted portion of the second semiconductor layer, which is formed in the step (c).

In one embodiment, in the step (c), the first semiconductor layer is entirely covered by a mask, and the first semiconductor layer is not etched.

In one embodiment, the method further includes, prior to the step (d), removing the first and second mask films, and covering each of the main portions of the first semiconductor layer and the second semiconductor layer with another mask.

In one embodiment, the method further includes, prior to the steps (b) to (d), forming a third mask film on the semiconductor film, wherein, in the step (b), the semiconductor film and the third mask film are etched, and a multi-layer structure of the first semiconductor layer and the third mask film is formed, wherein, in the step (c), the semiconductor film and the third mask film are etched, and a multi-layer structure of the second semiconductor layer and the third mask film is formed, and wherein, in the step (d), a p-type impurity is selectively implanted into the slanted portion of the first semiconductor layer and the slanted portion of the second semiconductor layer, using the third mask film as a mask.

In one embodiment, when viewed from the normal direction to the plane of the substrate, the first semiconductor layer has a first neck portion located between the first source region and the first drain region, and the second semiconductor layer has a second neck portion located between the second source region and the second drain region. The slanted portion of the first semiconductor layer is included in the first neck portion, and the slanted portion of the second semiconductor layer is included in the second neck portion.

Effects of the Invention

According to the present invention, in a semiconductor device or a display device that has an n-type TFT and a p-type TFT, it becomes possible to suppress the effect of the parasitic transistor formed in the n-type TFT to the TFT characteristics without increasing the effects of the parasitic transistor in the p-type TFT to the TFT characteristics. This allows the threshold voltages of the respective TFTs to be further reduced while ensuring that both n-type and p-type TFTs are turned off when the gate voltage is zero. As a result, the driving voltage of the semiconductor device can be reduced. Also, according to the present invention, it is possible to manufacture the above-mentioned semiconductor device or display device in a simple manner without significantly increasing the number of process steps.

BRIEF DESCRIPTION OF THE DRAWINGS

respectively show cross-sectional views along the line I-I' and the line II-II' in the plan view in FIG. 1(a).

DETAILED DESCRIPTION OF EMBODIMENTS

Embodiment 1

Below, with reference to figures, Embodiment 1 of a semiconductor device according to the present invention will be explained. The semiconductor device of the present embodiment is used for a substrate equipped with a CMOS such as an active matrix substrate equipped with a driver circuit that includes a CMOS. The semiconductor device of the present embodiment may also be used for an active matrix substrate of a display device that is provided with a memory circuit, which includes n-type and p-type TFTs, in each pixel.

Figure 1:
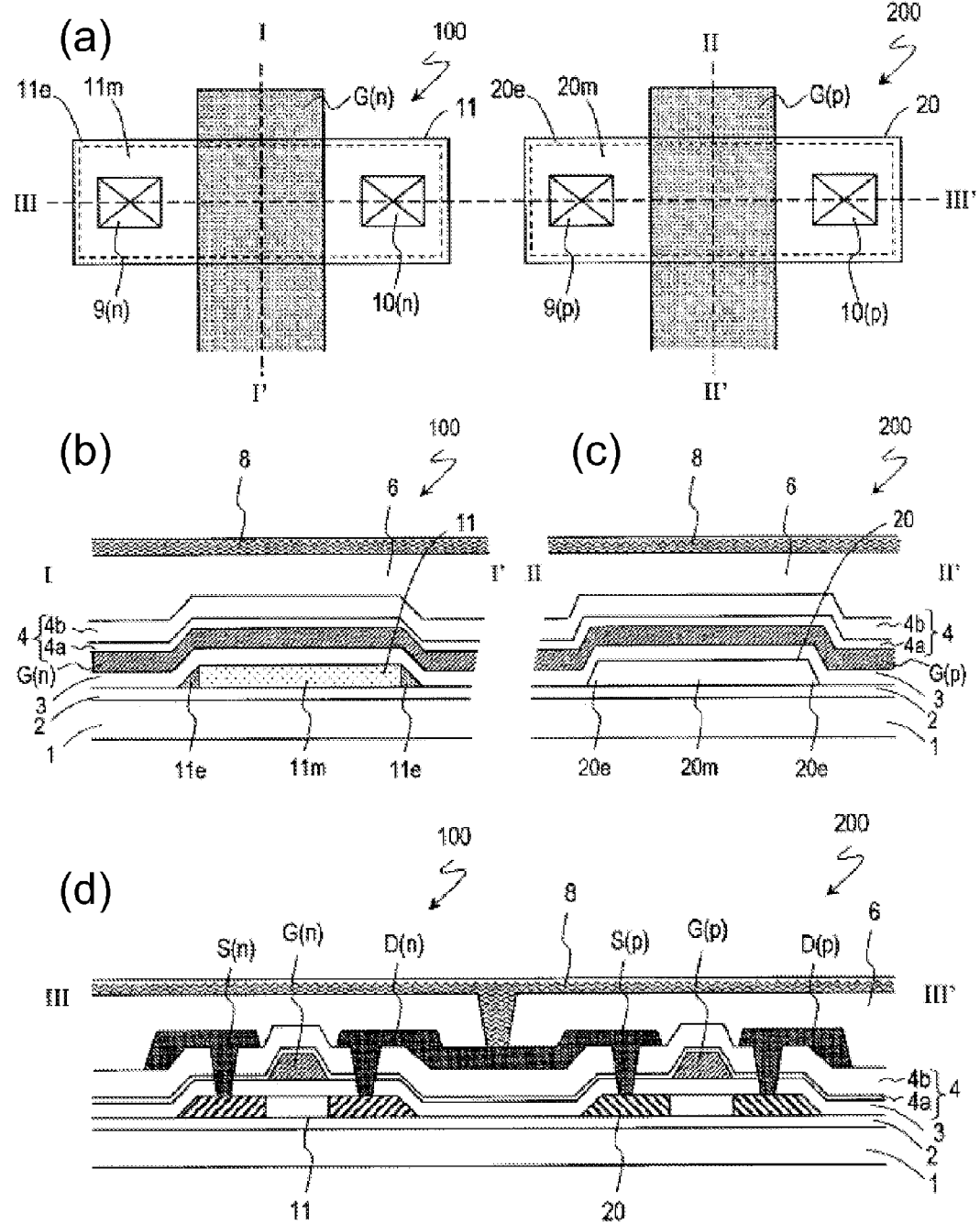
FIG. 1(a) is a plan view that schematically shows an n-type TFT and a p-type TFT in a semiconductor device according to Embodiment 1 of the present invention.
FIGS. 1(b) and 1(c)
FIG. 1(d) is a cross-sectional view along the line III-III' in the plan view in FIG. 1(a).

FIG. 1(a) is a plan view that schematically shows an n-type TFT and a p-type TFT in a semiconductor device of the present embodiment. FIGS. 1(b) and 1(c) respectively show cross-sectional views along the line I-I' and the line II-II' in the plan view in FIG. 1(a). FIG. 1(d) is a cross-sectional view along the line III-III' in the plan view in FIG. 1(a). The line I-I' and the line II-II' are perpendicular to the channel direction, and the line III-III' is parallel with the channel direction.

The semiconductor device of the present embodiment includes a substrate 1, and an n-type TFT (first thin film transistor) 100 and a p-type TFT (second thin film transistor) 200 that are formed above the substrate 1, having a base insulating film 2 interposed therebetween.

The n-type TFT 100 includes an island-shaped semiconductor layer (first semiconductor layer) 11 that has a source region (first source region), a drain region (first drain region), and a channel region (first channel region) located therebetween. Above the semiconductor layer 11, a gate electrode (first gate electrode) G(n) is disposed so as to overlap the channel region, and a gate insulating film 3 is interposed therebetween.

Similarly, the p-type TFT 200 includes an island-shaped semiconductor layer (second semiconductor layer) 20 that has a source region (second source region), a drain region (second drain region), and a channel region (second channel region) located therebetween. Above the semiconductor layer 20, a gate electrode (second gate electrode) G(p) is disposed so as to overlap the channel region, and the gate insulating film 3 is interposed therebetween.

On the gate insulating film 3 and the gate electrodes G(n) and G(p), a first interlayer insulating film 4 is formed. In this configuration, the first interlayer insulating film 4 has a two-layered structure that includes an insulating film 4a and an insulating film 4b. On the first interlayer insulating film 4, source electrodes S(n) and S(p) and drain electrodes D(n) and D(p) are disposed. The source region and the drain region of the semiconductor layer 11 are respectively connected to the source electrode S(n) and the drain electrode D(n) through contact portions 9(n) and 10(n) in contact holes formed in the first interlayer insulating film 4. Similarly, the source region and the drain region of the semiconductor layer 20 are respectively connected to the source electrode S(p) and the drain electrode D(p) through contact portions 9(p) and 10(p) in contact holes formed in the first interlayer insulating film 4.

On the first interlayer insulating film 4, a second interlayer insulating film (also referred to as a protective film) 6 is formed. On the second interlayer insulating film 6, an electrode film 8 is formed. In this example, the source electrode S(p) and the drain electrode D(n) are connected to the electrode film 8 through a contact hole formed in the second interlayer insulating film 6, thereby constituting a CMOS. The source electrodes and the drain electrodes are connected to wiring lines that are appropriately selected in accordance with the circuit configuration.

When the present embodiment is applied to a display device, it is preferable that the electrode film 8 be formed of the same conductive material as pixel electrodes. The pixel electrodes may be reflective electrodes made of Al, an Al alloy, or the like, or may be transparent electrodes made of ITO (Indium Tin Oxide) or the like, for example. This way, the pixel electrodes and the electrode film 8 can be formed simultaneously, using the same conductive film.

Figure 2:
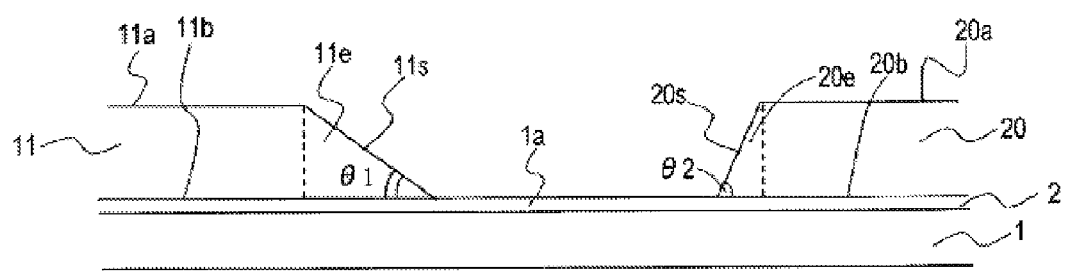
FIG. 2 is a cross-sectional view that shows shapes of respective semiconductor layers of an n-type TFT and a p-type TFT.

FIG. 2 is a cross-sectional view showing shapes of slanted portions 11e and 20e of the semiconductor layers 11 and 20.

In the present embodiment, the semiconductor layer 11 and the semiconductor layer 20 are formed of the same semiconductor film. The semiconductor layer 11 has a slanted portion 11e formed in the periphery thereof and a main portion 11m that is made of a portion other than the slanted portion 11e. Similarly, the semiconductor layer 20 has a slanted portion 20e formed in the periphery thereof and a main portion 20m that is made of a portion other than the slanted portion 20e. The slanted portion 11e is extended in the same direction as a direction in which the channel region of the semiconductor layer 11 is extended, and the slanted portion 20e is extended in the same direction as a direction in which the channel region of the semiconductor layer 20 is extended.

The slanted portion 11e is a portion (tapered portion) that is sandwiched by a side face 11s of the semiconductor layer 11, which is inclined relative to a plane 1a of the substrate 1, and a lower surface 11b of the semiconductor layer 11. The main portion 11m is a portion sandwiched by an upper surface 11a and the lower surface 11b of the semiconductor layer 11. The slanted portion 20e is a portion (tapered portion) that is sandwiched by a side face 20s of the semiconductor layer 20, which is inclined relative to the plane 1a of the substrate 1, and a lower surface 20b of the semiconductor layer 20. The main portion 20m is a portion sandwiched by an upper surface 20a and the lower surface 20b of the semiconductor layer 20.

The main portions 11m and 20m may also be referred to as "planarized portions." However, it is also possible that the upper surfaces of the main portions 11m and 20m have recesses and protrusions (such as recesses and protrusions on the surface of the semiconductor film before patterning the film, for example), even though these upper surfaces are shown to be substantially planarized in the example shown in the figure.

The inclination angle $\theta_2$ of the side face 20s of the semiconductor layer 20 relative to the plane 1a of the substrate 1 is larger than the inclination angle $\theta_1$ of the side face 11s of the semiconductor layer 11. The inclination angle $\theta_1$ is set to 30° or greater and 45° or smaller, and the inclination angle $\theta_2$ is set to 45° or greater and 60° or smaller. The semiconductor layers 11 and 20 are obtained by patterning the same semiconductor film in the manufacturing process, and thus have substantially the same thickness. Therefore, when viewed from the normal direction to the plane 1a of the substrate 1, the area of the slanted portion 11e of the semiconductor layer 11 is larger than the area of the slanted portion 20e of the semiconductor layer 20. The volume of the slanted portion 11e is also larger than the volume of the slanted portion 20e.

The slanted portion 11e and the slanted portion 20e are doped with a p-type impurity. This makes it possible to move the voltage-current characteristics of the parasitic transistor, which is formed in the slanted portion 11e, so as to overlap the voltage-current characteristics of the main portion 11m. In other words, the component of the parasitic transistor that is formed due to the presence of the slanted portion 11e can be reduced or eliminated. In order to improve the manufacturing efficiency, it is preferable to dope the p-type impurity into both of the slanted portion 11e and the slanted portion 20e simultaneously from above. However, in such a case, if the inclination angle $\theta_2$ of the side face of the slanted portion 20e is as small as the inclination angle $\theta_1$ of the side face of the slanted portion 11e, the slanted portion 20e would be doped with approximately the same amount of the p-type impurity as the slanted portion 11e. As a result, the component of the parasitic transistor that is formed due to the presence of the slanted portion 20e is made larger, which adversely affects the voltage-current characteristics of the p-type TFT.

In the present embodiment, the inclination angle $\theta_1$ of the side face 11s is made to differ from the inclination angle $\theta_2$ of the side face 20s such that the region doped with the p-type impurity in the semiconductor layer 20 is reduced, and therefore, it is possible to almost completely eliminate the effect of the parasitic transistor component resulting from the slanted portion 20e, and to sufficiently reduce the parasitic transistor component resulting from the slanted portion 11e only.

Figure 3:
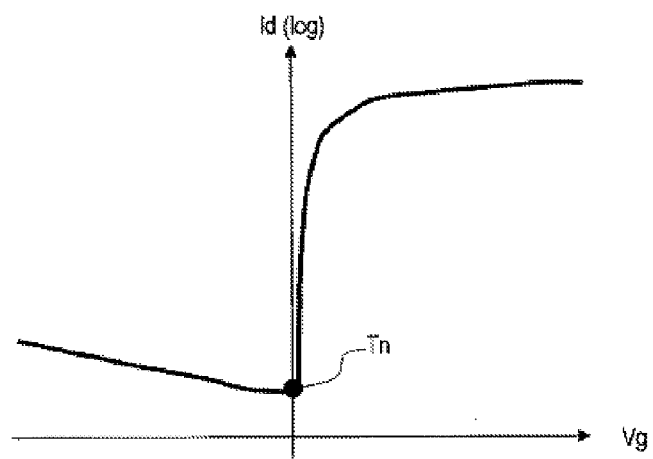
FIGS. 3(a) and 3(b) are graphs respectively showing examples of the voltage-current characteristics of the n-type TFT and the p-type TFT in the semiconductor device of Embodiment 1 of the present invention.
Figure 3:
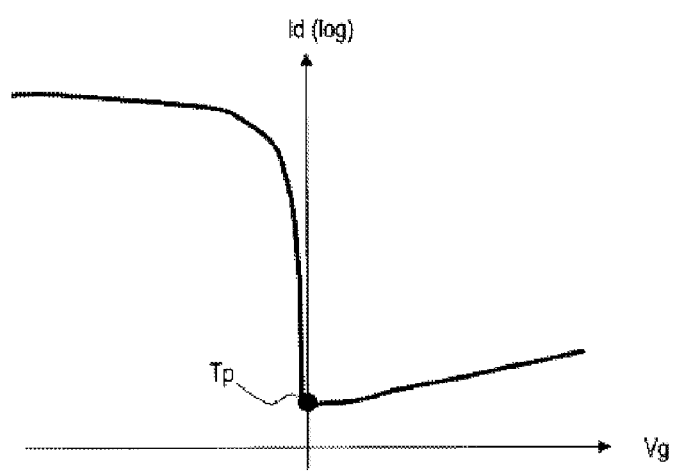
Figure 4:
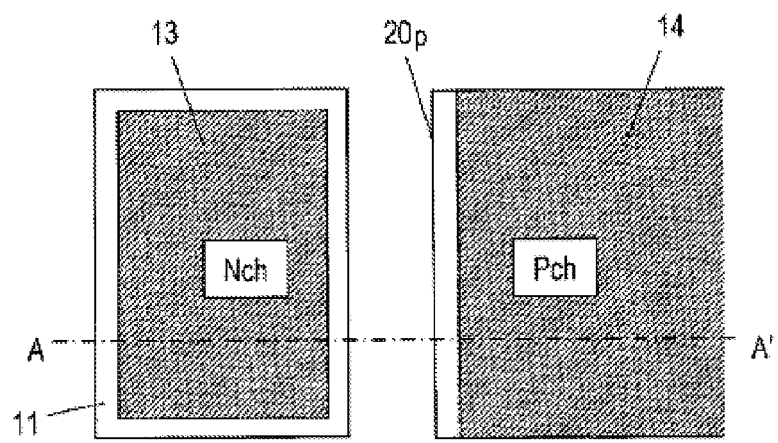
FIGS. 4(a) and 4(b) are a plan view and a cross-sectional view that schematically illustrate a method of manufacturing the semiconductor device according to Embodiment 1 of the present invention, respectively.
Figure 4:
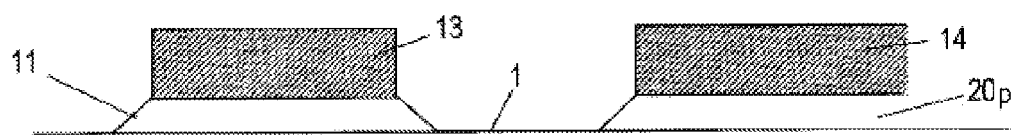
Figure 5:
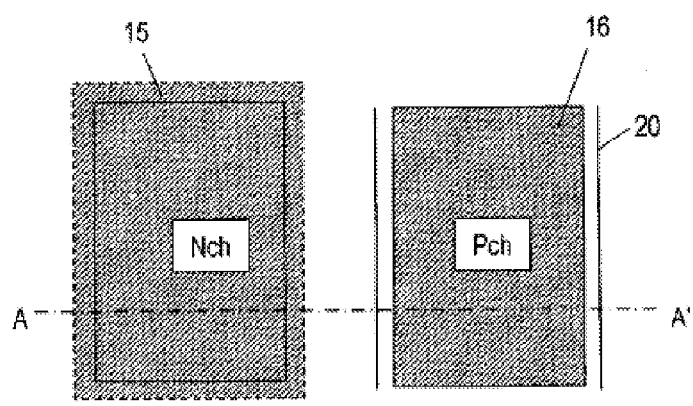
FIGS. 5(a) and 5(b) are a plan view and a cross-sectional view that schematically illustrate a method of manufacturing the semiconductor device according to Embodiment 1 of the present invention, respectively.
Figure 5:
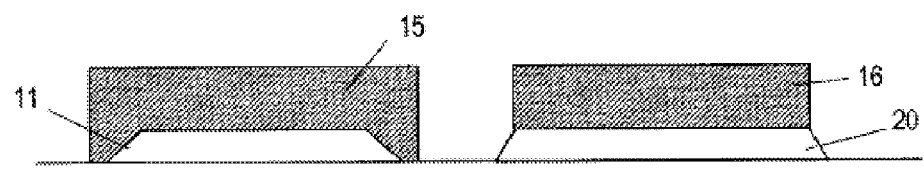
Figure 6:
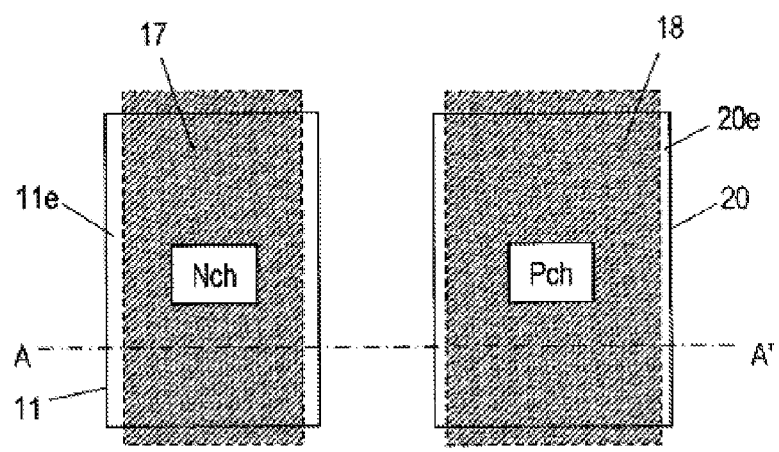
FIGS. 6(a) and 6(b) are a plan view and a cross-sectional view that schematically illustrate a method of manufacturing the semiconductor device according to Embodiment 1 of the present invention, respectively.
Figure 6:
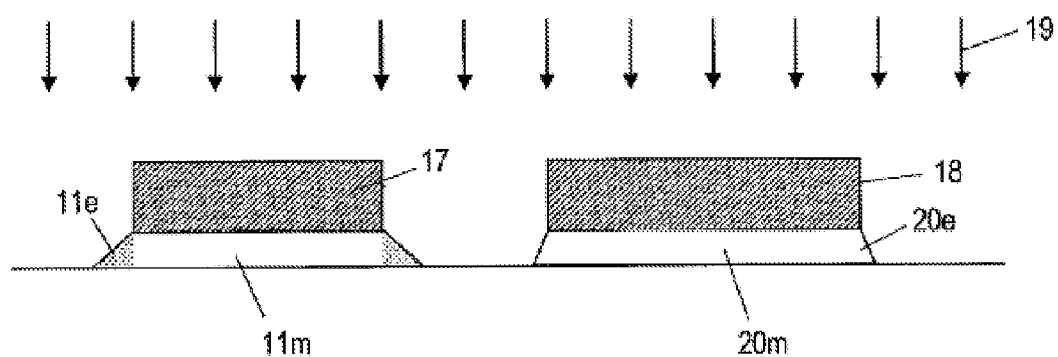
Figure 7:
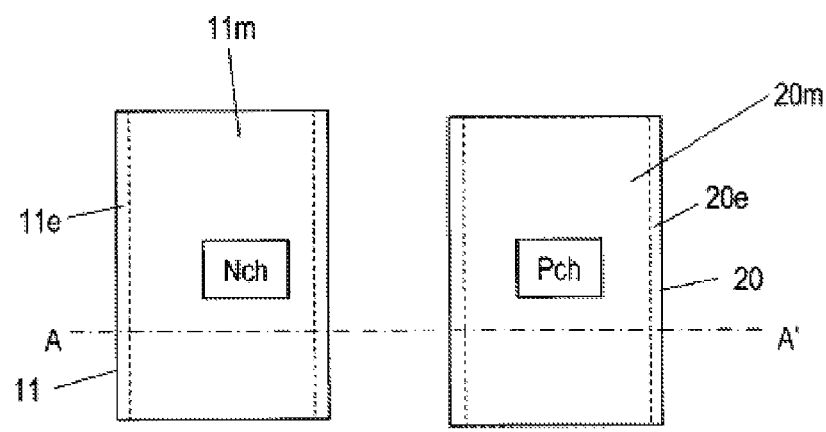
FIGS. 7(a) and 7(b) are a plan view and a cross-sectional view that schematically illustrate a method of manufacturing the semiconductor device according to Embodiment 1 of the present invention, respectively.
Figure 7:
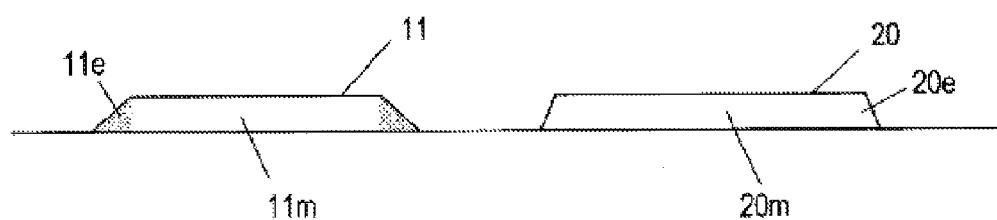
Figure 20:
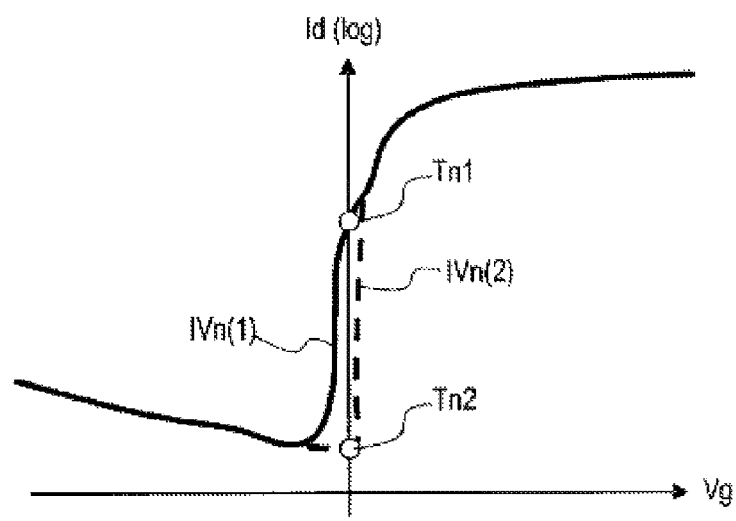
FIGS. 20(a) and 20(b) are graphs respectively showing examples of voltage-current characteristics of an n-type TFT and a p-type TFT in which respective semiconductor layers have slanted portions and planarized portions.
Figure 20:
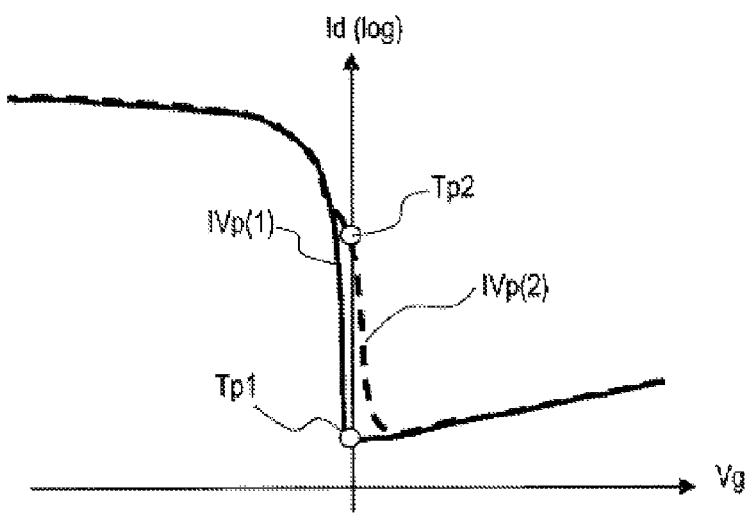

FIGS. 3(a) and 3(b) respectively show examples of the voltage-current characteristics of the n-type TFT 100 and the p-type TFT 200. As is clear from the comparison between these characteristics and the characteristics described above using FIG. 20, in both the n-type TFT 100 and the p-type TFT 200 of the present embodiment, the effects of the characteristics of the slanted portions 11e and 20e (characteristics of the parasitic transistor) to the TFT characteristics are suppressed. That is, when the ON current drives up, the "hump" (two-step change) does not appear in the voltage-current characteristics, unlike the characteristics shown in FIG. 20. This makes it possible to lower the source-drain voltages Tn and Tp at the gate voltage of 0V in the n-type TFT 100 and the p-type TFT 200, allowing for a reduction in the threshold voltages for turning off the TFTs.

Next, an overview of a method of manufacturing the semiconductor device of the present embodiment will be explained with reference to FIGS. 4 to 7.

In each of FIGS. 4 to 7, (a) is a plan view showing regions of the semiconductor layers 11 and 20, and (b) is a cross-sectional view along the line A-A' in the plan view in (a). The line A-A' is parallel with the channel width direction. That is, in FIGS. 4 to 7, unlike the configuration shown in FIG. 1, the semiconductor layers 11 and 20 are arranged side by side in the channel width direction.

There is no special limitation on the arrangement pattern of these TFTs, and it can be appropriately modified in accordance with a circuit configuration to be adopted and the like. Although FIGS. 4 to 7 respectively show a single n-type TFT and a single p-type TFT formed on the same substrate, the respective TFTs may be plurally formed on the same substrate. In FIGS. 4 to 7, the base insulating film 2 is not shown.

First, a semiconductor film that contains a p-type impurity is formed on the substrate 1, and on the semiconductor film, mask films (resist films, for example) 13 and 14 are formed. Thereafter, using the mask films 13 and 14 as masks, the semiconductor film is patterned. As a result, as shown in FIGS. 4(a) and 4(b), the semiconductor layer 11, which becomes an active layer of the n-type TFT 100, and a semiconductor layer 20p that includes the semiconductor layer 20, which becomes an active layer of the p-type TFT 200, are formed on the substrate 1. At this point, the semiconductor layer 11 has been patterned into a shape (final shape) of the active layer of the n-type TFT 100.

Next, the semiconductor layer 11 is covered by a mask film 15, and the semiconductor layer 20p is patterned using a mask film 16. As a result, as shown in FIGS. 5(a) and 5(b), the semiconductor layer 20, which becomes an active layer of the p-type TFT 200, is obtained. At this point, the semiconductor layer 20 has been patterned into a shape (final shape) of the active layer of the p-type TFT. The inclination angle $\theta_2$ of the edge face of the semiconductor layer 20 is larger than the inclination angle $\theta_1$ of the edge face of the semiconductor layer 11.

Next, as shown in FIGS. 6(a) and 6(b), mask films 17 and 18 are formed so as to cover the respective main portions 11m and 20m of the semiconductor layer 11 and the semiconductor layer 20, and a p-type impurity (boron, for example) 19 is implanted into the respective edge portions 11e and 20e only. Because the edge portion 20e of the semiconductor layer 20 has a smaller exposed area, the amount of the impurity implanted into the edge portion 20e is significantly smaller than that of the edge portion 11e of the semiconductor layer 11.

Thereafter, the mask films 17 and 18 are removed, and as shown in FIGS. 7(a) and 7(b), the semiconductor layers 11 and 20 are completed. The edge portion 11e of the semiconductor layer 11 is doped with the sufficient amount of p-type impurity, and the amount of the p-type impurity doped into the edge portion 20e of the semiconductor layer 20 is significantly small. Therefore, in both of the n-type TFT 100 and the p-type TFT 200, respectively, the negative effects of the parasitic transistors caused by the edge portions 11e and 20e are suppressed.

Below, with reference to figures, the method of manufacturing the semiconductor device of the present embodiment will be explained more specifically. In the explanation below, steps that are generally performed in a process of fabricating a TFT such as activation annealing and hydrogenation are omitted.

FIGS. 8(a) to 8(h) are process cross-sectional views for explaining an example of the method of manufacturing the semiconductor device of the present embodiment, respectively. These drawings show cross-sections along the channel width direction.

First, as shown in FIG. 8(a), after forming a base film 2a and a base film 2b on the substrate 1, a crystalline semiconductor film 30 is formed thereon so as to cover a wide area on the substrate 1. The base film 2a and the base film 2b constitute the base insulating film 2. Next, on the crystalline semiconductor film 30, the mask films (resist mask films) 13 and 14 are formed by photolithography.

A low-alkali glass substrate or a quartz substrate, for example, is used as the substrate 1. The base film 2a is made of silicon nitride, for example, and the base film 2b is made of silicon oxide, for example. The base films 2a and 2b can be formed by the plasma CVD method, for example. In the present embodiment, the base film has two layers, but it is also possible to form the base film of a single layer of a silicon oxide film, for example. The base films 2a and 2b can also be made of other materials such as silicon oxide nitride.

In the present embodiment, a crystalline silicon film (20 to 150 nm thick, for example; preferably 30 to 80 nm thick) is formed as the crystalline semiconductor film 30. The crystalline silicon film is formed by depositing an amorphous silicon (a-Si) film on the base film 2b, first, and after adding nickel (Ni) thereto, performing the solid phase crystallization (SPC). Alternatively, the crystalline silicon film may be formed by directly radiating excimer laser to the a-Si film for crystallization.

Next, as shown in FIG. 8(b), using the photoresist mask films 13 and 14 as masks, the crystalline semiconductor film 30 is etched into island-shaped layers. This way, the semiconductor layer 11, which later becomes an active layer (source/drain regions, channel region) of the n-type TFT, and the semiconductor layer 20p that includes the semiconductor layer 20, which later becomes an active layer of the p-type TFT, are obtained. The semiconductor layer 20p is formed to be larger than the final shape of the semiconductor layer that becomes the active layer of the p-type TFT in the channel width direction. The thickness of the semiconductor layers 11 and 20p is 50 nm, for example.

The crystalline semiconductor film 30 is etched using a mixed gas that is obtained by appropriately mixing a plurality of types of gases such that the side faces of the edge portions of the semiconductor layers 11 and 20p, which are formed as a result of the etching, are inclined at an angle of 30 to 45° relative to the plane of the substrate 1. In the present embodiment, the etching is performed by the RIE (reactive ion etching) method using an etching gas that is obtained by mixing tetrafluoromethane ($CF_4$) and oxygen ($O_2$) with a ratio of 8:2, for example.

Next, as shown in FIG. 8(c), the semiconductor layer 11 is covered by the mask film 15 made of a photoresist, and the mask film 16 is formed on the semiconductor layer 20p. The mask film 16 is formed with a smaller width than that of the semiconductor layer 20p.

Next, by etching the semiconductor layer 20p using the mask film 16 as a mask, the semiconductor layer 20, which later becomes the active layer of the p-type TFT, is obtained as shown in FIG. 8(d). The semiconductor layer 20p is etched using a mixed gas that is obtained by appropriately mixing a plurality of types of gases such that the side face of the edge portion of the semiconductor layer 20, which is formed as a result of the etching, is inclined at an angle of 45 to 60° relative to the plane of the substrate 1. In the present embodiment, the etching is performed by the RIE method using an etching gas that is obtained by mixing tetrafluoromethane ($CF_4$) and oxygen ($O_2$) with a ratio of 9:1, for example.

Next, as shown in FIG. 8(e), after removing the mask films 15 and 16, the mask films 17 and 18 are formed so as to expose the edge portions of the semiconductor layers 11 and 20. Alternatively, the mask film 17 may be formed by patterning the mask film 15. Here, in the slanted portions 11e and 20e of the semiconductor layers 11 and 20, the mask films 17 and 18 need to be formed such that parts thereof that may form parasitic transistors are exposed. Therefore, the mask films 17 and 18 may be formed so as to expose the entire slanted portions 11e and 20e of the semiconductor layers 11 and 20, or may be formed so as to only expose parts that are extended in the channel direction in the slanted portions 11e and 20e.

Next, in this state, as shown in FIG. 8(f), a low concentration p-type impurity 19 is doped from above the substrate surface. Here, boron is used as the p-type impurity 19. As the boron injection conditions in this doping, the acceleration voltage is set to 5 to 20 kV, and the dosage is set to $5 \times 10^{11}$ to $1 \times 10^{13}$ cm$^{-2}$, for example. This way, the p-type impurity 19 is implanted into the portions (slanted portions) 11e and 20e only, which are exposed from the mask films 17 and 18 in the semiconductor layers 11 and 20. The p-type impurity 19 is not implanted into portions (main portions) 11m and 20m that are covered by the mask films 17 and 18 in the semiconductor layers 11 and 20.

Because the inclination angle of the side face of the semiconductor layer 11 is smaller than the inclination angle of the side face of the semiconductor layer 20, the volume of the slanted portion 11e is larger than the volume of the slanted portion 20e. As a result, the amount of the p-type impurity 19 that is doped into the edge portion of the semiconductor layer 11 is greater than the amount of the p-type impurity 19 that is doped into the edge portion of the semiconductor layer 20. Therefore, this doping affects the semiconductor layer 11, but not the semiconductor layer 20 almost at all.

Thereafter, the mask films 17 and 18 are removed, and as shown in FIG. 8(g), the semiconductor layers 11 and 20 that have mutually different doping amounts are completed.

Next, as shown in FIG. 8(h), a gate insulating film 3 and a gate electrode film 7 are formed on the semiconductor layers 11 and 20. Although not shown in this cross-sectional view, the source and drain regions of the semiconductor layer 11 are formed by doping the p-type impurity therein. Similarly, the source and drain regions of the semiconductor layer 20 are formed by doping the n-type impurity therein. Thereafter, on the gate electrode film 7, the first interlayer insulating film 4 is formed. In this configuration, the first interlayer insulating film 4 has a two-layered structure of the insulating film 4a made of silicon nitride and the insulating film 4b made of silicon oxide.

Further, although not shown in this cross-sectional view, on the first interlayer insulating film 4, source electrodes and drain electrodes of the respective TFTs are disposed. As shown in FIG. 1(d), the source electrodes are connected to the source regions of the respective TFTs through contact holes formed in the first interlayer insulating film 4 and the gate insulating film 3. Similarly, the drain electrodes are connected to the drain regions of the respective TFTs through contact holes formed in the first interlayer insulating film 4 and the gate insulating film 3. This way, the n-type TFT 100 and the p-type TFT 200 are obtained.

Next, the second interlayer insulating film 6 that is a resin layer is formed so as to cover the n-type TFT 100 and the p-type TFT 200. Also, in the present embodiment, an electrode film 8, which becomes a pixel electrode, is formed on the second interlayer insulating film 6. As shown in FIG. 1(d), the electrode film 8 is electrically connected to the drain electrode of the n-type TFT and the source electrode of the p-type TFT through a contact hole formed in the second interlayer insulating film 6.

Figure 8:
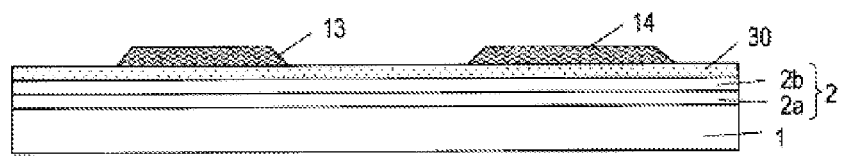
FIGS. 8(a) to 8(h) are process cross-sectional views that respectively illustrate an example of a method of manufacturing the semiconductor device according to Embodiment 1 of the present invention.
Figure 8:
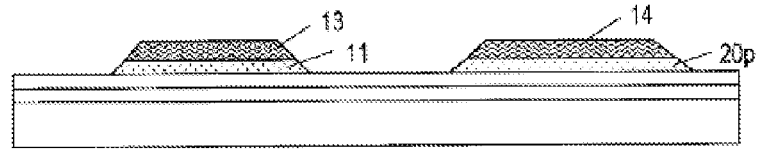
Figure 8:
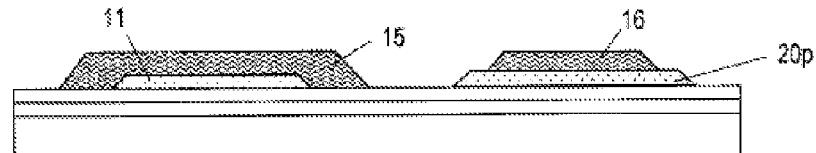
Figure 8:
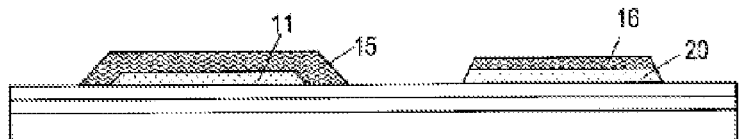
Figure 8:
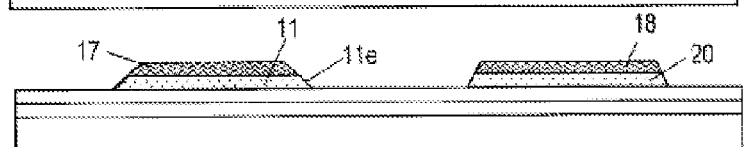
Figure 8:
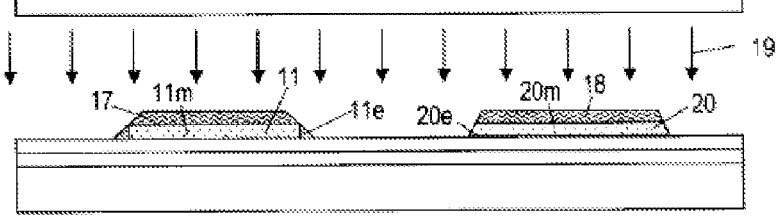
Figure 8:
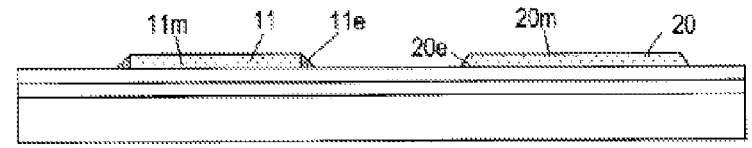
Figure 8:
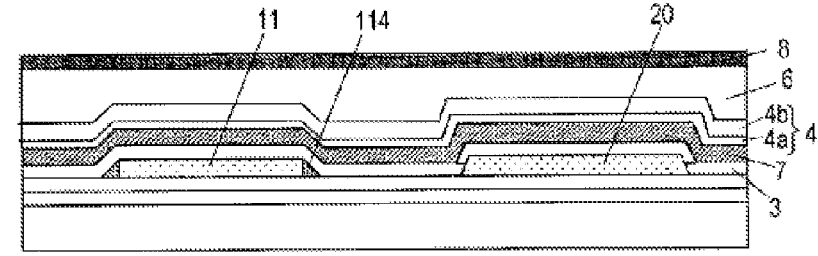

In the process shown in FIG. 8, the semiconductor layer 11 of the n-type TFT 100 was formed before the semiconductor layer 20 of the p-type TFT 200, but the semiconductor layer 11 may be formed after the semiconductor layer 20. Also, if necessary, a p-type impurity may be doped into the semiconductor layers 11 and 20 of the respective TFTs (channel-doping) in the middle of the process so as to control the threshold voltages Vth of the n-type TFT 100 and of the p-type TFT 200 separately. In the channel-doping, the concentrations of the p-type impurity in the main portions of these semiconductor layers 11 and 20 may be made to differ from each other by selectively performing the channel-doping to one of the semiconductor layers 11 and 20, or by performing the channel-doping to the two semiconductor layers separately.

According to the manufacturing method of the present embodiment, it is possible to adjust the voltage-current characteristics of both of the n-type TFT 100 and the p-type TFT 200 with the single doping. This allows for a reduction in the threshold voltages of the two TFTs without making the manufacturing process complex.

Figure 21:
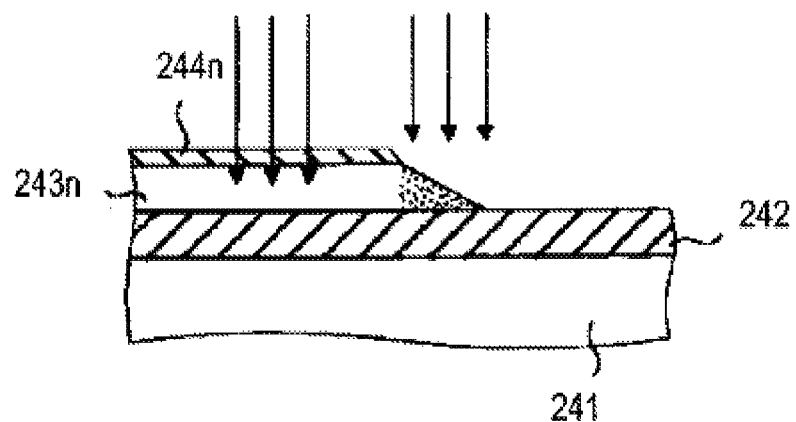
FIGS. 21(a) and 21(b) are cross-sectional views respectively showing a method of manufacturing an n-type TFT and a p-type TFT, which is disclosed in Patent Document 1.
Figure 21:
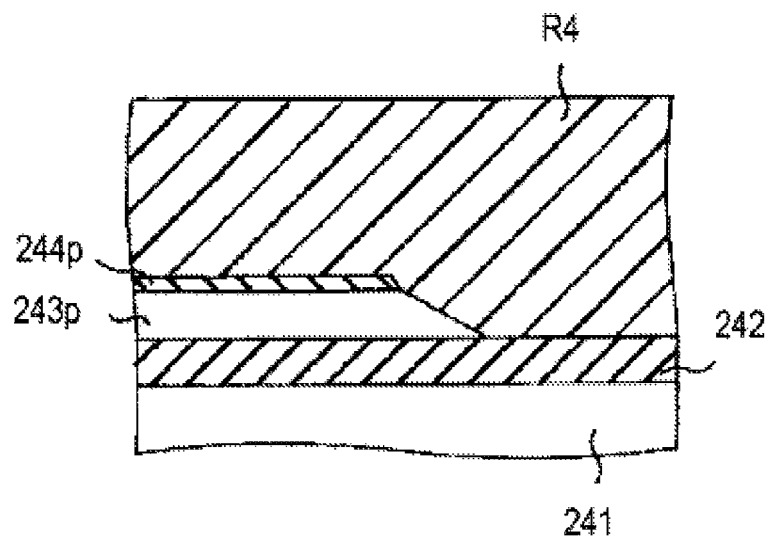

In the conventional method shown in FIG. 21, when the p-type impurity is implanted into the slanted portion of the n-type TFT, the entire p-type TFT needs to be covered by a resist film, and therefore, the resist film on the slanted portion of the p-type TFT is exposed to the impurity doping at a higher concentration than normal. This may cause the property of the resist film to change, and consequently, the resist film on the slanted portion cannot be removed, which possibly results in a problem of defects in the TFT characteristics or the contamination of the apparatus.

According to the manufacturing method of the present invention, because the slanted portions of the respective semiconductor layers are not covered by a resist when the p-type impurity is implanted, even after the high-concentration impurity was implanted, the resist can be removed with ease by a normal method such as plasma ashing. This makes it possible to suppress or prevent the defects in the characteristics, the apparatus contamination, and the like, which result from the change in the resist property and the residual resist.

In the conventional method, the gate insulating film formed on the planarized portions of the semiconductor layers is made of two layers of the mask layers and the insulating film formed thereon. In order to minimize the threshold voltages Vth of the TFTs, it is necessary to reduce the thickness of the gate insulating film, however, with the conventional method, because the gate insulating film needs to have two layers, the thickness thereof cannot be reduced to a sufficient level.

In the conventional method, if the mask layers are removed, instead of being used as the gate insulating film, the thickness of the gate insulating film could be reduced, but it would create a need for a removal step of the two mask layers, in addition to the forming step thereof, thereby increasing the number of process steps. In addition, in removing the mask layers, the base insulating film, which is made of the same silicon oxide film as the mask layers, is also etched. This may result in a problem of a step being formed in the base insulating film at the edge portions of the semiconductor layers, which makes defects such as disconnections of gate wiring more likely to occur. According to the manufacturing method of the present invention, it is possible to prevent such a problem from occurring.

With the method described in Patent Document 1, the "hump" resulting from the parasitic transistor in the n-type TFT can be prevented from appearing, but because the thickness of gate insulating film cannot be reduced, it is difficult to sufficiently reduce the threshold voltage Vth.

According to the present embodiment, it is not necessary to form the gate insulating film that has a two-layer structure on the semiconductor layers. This allows for a significant reduction in the thickness of the gate insulating film, and therefore, it becomes possible to sufficiently reduce the threshold voltage Vth. Also, in the etching step of the semiconductor layer, the sufficient etching select ratio between the semiconductor layer and the base film can be achieved. Therefore, it is possible to prevent the surface layer portion of the base film from being etched together with the semiconductor layer, thereby preventing a step between the semiconductor layer pattern and the base film in the vicinity thereof from being made larger. Because this allows the gate insulating film to cover the step more reliably, there is no need to form a thick gate insulating film. As a result, the threshold voltage Vth can be sufficiently reduced.

According to the present embodiment, the thickness of the gate insulating film 3 can be selected with a higher degree of freedom, and therefore, it is possible to obtain the thickness that is most suited for the device to be provided. It is preferable that the thickness of the gate insulating film 3 do not exceed the thickness of the semiconductor layers 11 and 20. It is preferable that the thickness of the gate insulating film be set to 25 nm or more and 50 nm or less, for example. This makes it possible to effectively reduce the threshold voltages Vth of the respective TFTs, and as a result, the driving voltage of the semiconductor device can be further reduced.

By adopting the present embodiment, the threshold voltage Vth of the n-type TFT can be significantly reduced as compared with the conventional configuration. In the conventional n-type TFT, when the thickness of the gate insulating film is 70 nm, the lower limit of the threshold voltage of the n-type TFT was about 1.3V. In contrast, in the present embodiment, by implanting the p-type impurity into the slanted portion of the n-type semiconductor layer, the lower limit of the threshold voltage Vth of the n-type TFT can be reduced to 0.8V, which is 0.5V lower than the conventional configuration. When the thickness of the gate insulating film is 40 nm, the lower limit of the threshold voltage of the conventional n-type TFT was about 0.9V, but in the present embodiment, the lower limit of the threshold voltage Vth of the n-type TFT can be reduced to 0.5V. Further, according to the present embodiment, even if the thickness of the gate insulating film is reduced to 40 nm or smaller, for example, the reliability can be ensured.

The semiconductor device of the present embodiment can be suitably used for a display device that is equipped with a memory circuit (image memory) in each pixel for storing display data. In the display device equipped with the image memories, the power consumption can be significantly reduced because the data transfer is not needed unless the display data changes. When the semiconductor device according to the present embodiment (SRAM circuit, DRAM circuit, or the like) is used as the image memory of such a display device, the power consumption of the display device can be further reduced. Specifically, it becomes possible to significantly reduce the panel driving voltage as compared with the conventional configuration (to less than 2V, for example). As a result, it becomes no longer necessary to provide a booster circuit, and the device can be driven by a button battery or the like (3V drive), for example. Such a display device can also be suitably used for applications that perform a constant display, for example.

Embodiment 2

A semiconductor device according to Embodiment 2 of the present invention will be explained. The basic configuration of the semiconductor device of the present embodiment is the same as that of the semiconductor device of Embodiment 1. Therefore, in the following description, the same reference characters are given to constituting elements that are the same or that have the same functions as those of Embodiment 1, and the detailed descriptions thereof are omitted.

Figure 9:
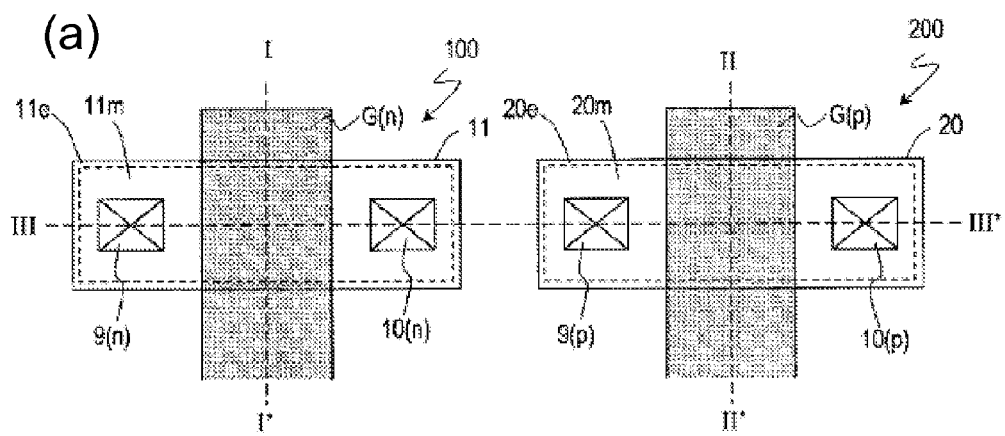
FIG. 9(a) is a plan view that schematically shows an n-type TFT and a p-type TFT in a semiconductor device according to Embodiment 2 of the present invention.
FIGS. 9(b) and 9(c) are cross-sectional views along the line I-I' and the line II-II' in the plan view in FIG. 1(a), respectively.
FIG. 9(d) is a cross-sectional view along the line III-III' in the plan view in FIG. 9(a).
Figure 9:
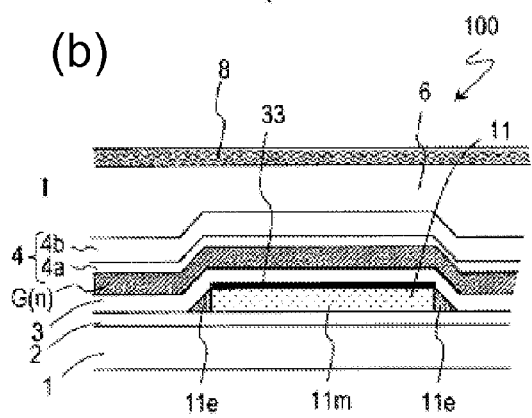
Figure 9:
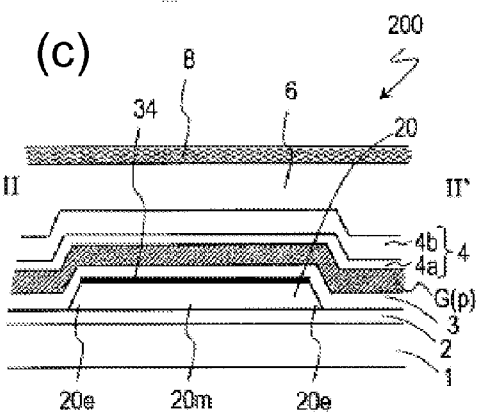
Figure 9:
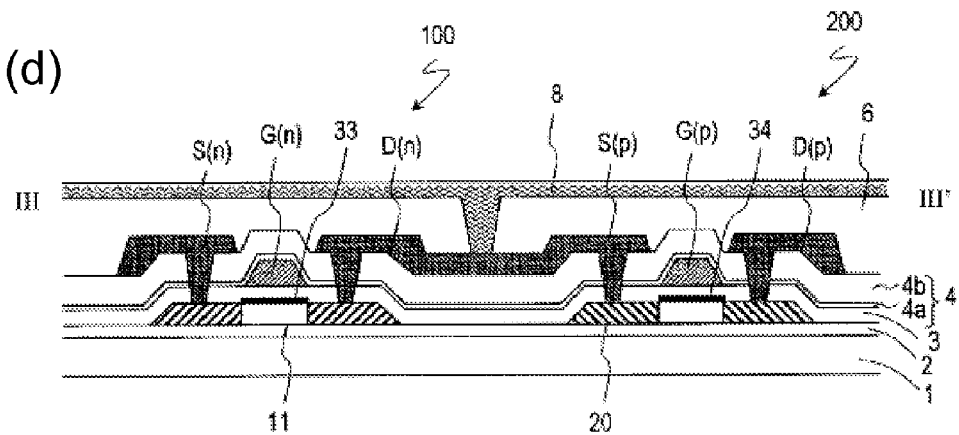

FIG. 9(a) is a plan view that schematically shows an n-type TFT and a p-type TFT in the semiconductor device of the present embodiment. FIGS. 9(b) and 9(c) respectively show cross-sectional views along the line I-I' and the line II-II' in the plan view in FIG. 9(a). FIG. 9(d) is a cross-sectional view along the line III-III' in the plan view in FIG. 9(a). The line I-I' and the line II-II' are perpendicular to the channel direction, and the line III-III' is parallel with the channel direction.

The semiconductor device of the present embodiment includes an n-type TFT 100 and a p-type TFT 200 that are formed above a substrate 1, having a base insulating film 2 interposed therebetween. A gate electrode G(n) is disposed above a semiconductor layer 11 of the n-type TFT 100, and a gate insulating film 3 and a mask film 33 made of silicon oxide, for example, are interposed therebetween. A gate electrode G(p) is disposed above a semiconductor layer 20 of the p-type TFT 200, and the gate insulating film 3 and a mask film 34 made of silicon oxide, for example, are interposed therebetween. On the gate insulating film 3 and the gate electrodes G(n) and G(p), a first interlayer insulating film 4 having a two-layered structure, source electrodes S(n) and S(p), and drain electrodes D(n) and D(p) are formed. On the first interlayer insulating film 4, a second interlayer insulating film 6 and an electrode film 8 are formed.

The shapes of the slanted portions 11e and 20e of the semiconductor layers 11 and 20 are the same as those described above using FIG. 2. Therefore, it is also possible with Embodiment 2 to sufficiently reduce the parasitic transistor component that results from the slanted portion 11e of the semiconductor layer 11 only, while eliminating the effect of the parasitic transistor component that results from the slanted portion 20e of the semiconductor layer 20 almost completely.

Figure 10:
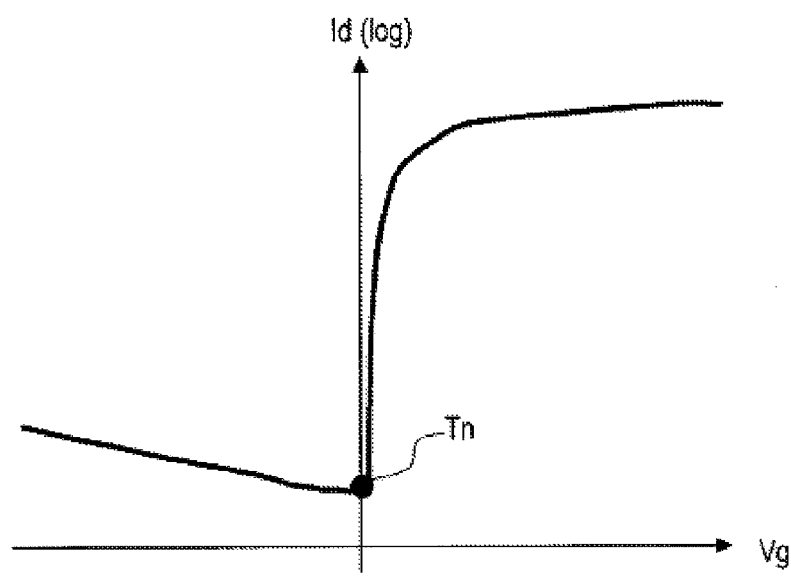
FIGS. 10(a) and 10(b) are graphs respectively showing examples of the voltage-current characteristics of the n-type TFT and the p-type TFT in the semiconductor device of Embodiment 2 of the present invention.
Figure 10:
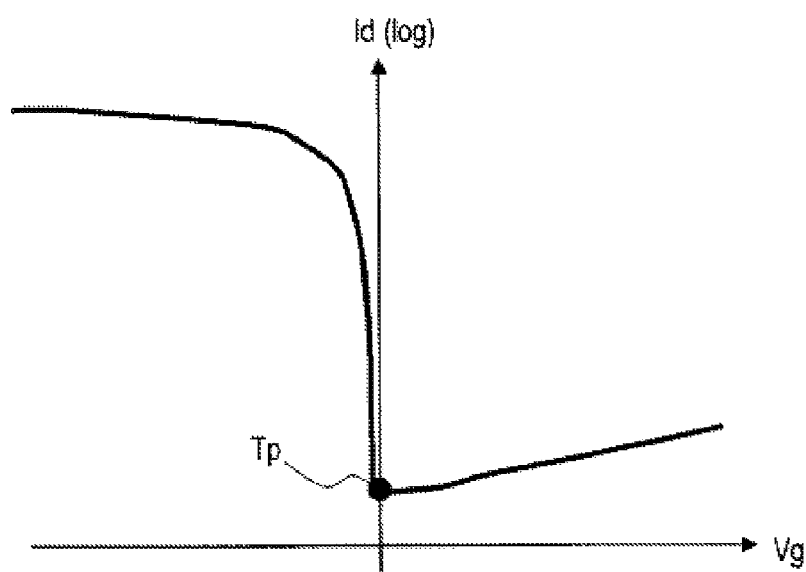
Figure 11:
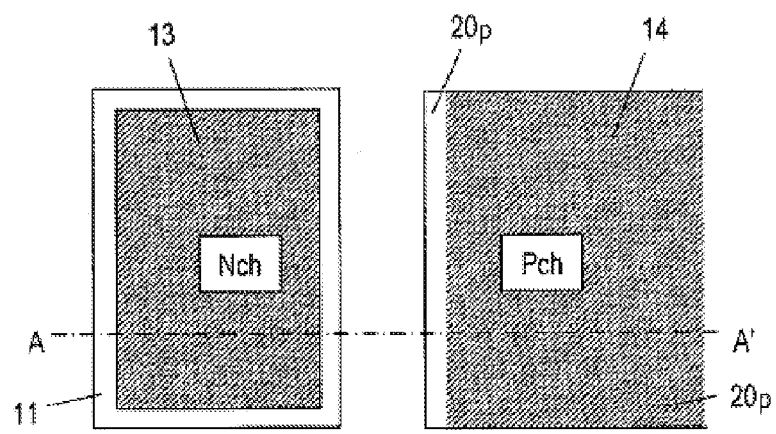
FIGS. 11(a) and 11(b) are a plan view and a cross-sectional view that schematically illustrate a method of manufacturing the semiconductor device according to Embodiment 2 of the present invention, respectively.
Figure 11:
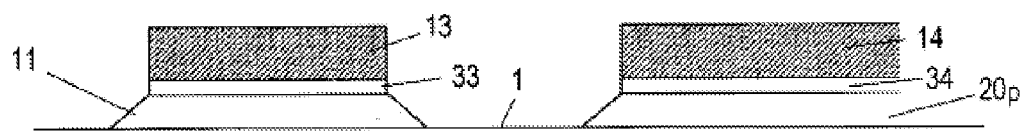
Figure 12:
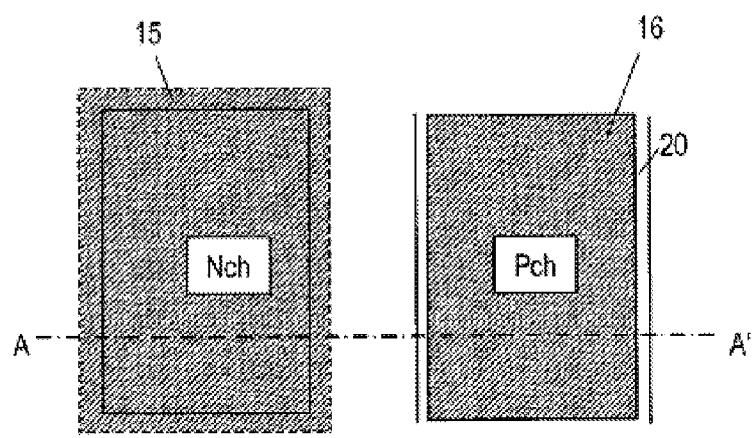
FIGS. 12(a) and 12(b) are a plan view and a cross-sectional view that schematically illustrate a method of manufacturing the semiconductor device according to Embodiment 2 of the present invention, respectively.
Figure 12:
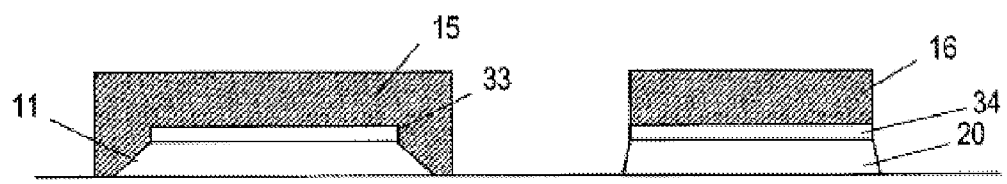
Figure 13:
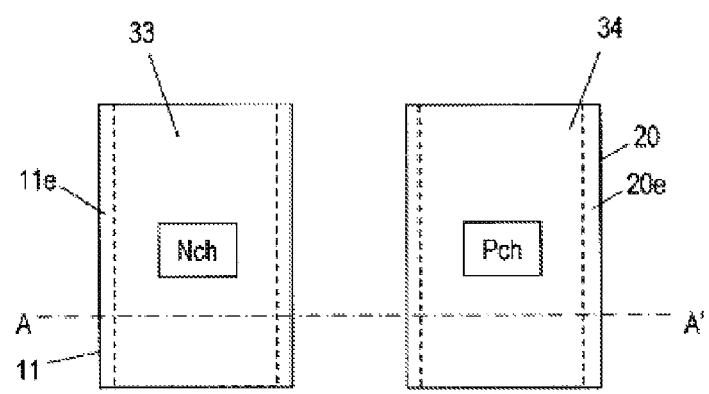
FIGS. 13(a) and 13(b) are a plan view and a cross-sectional view that schematically illustrate a method of manufacturing the semiconductor device according to Embodiment 2 of the present invention, respectively.
Figure 13:
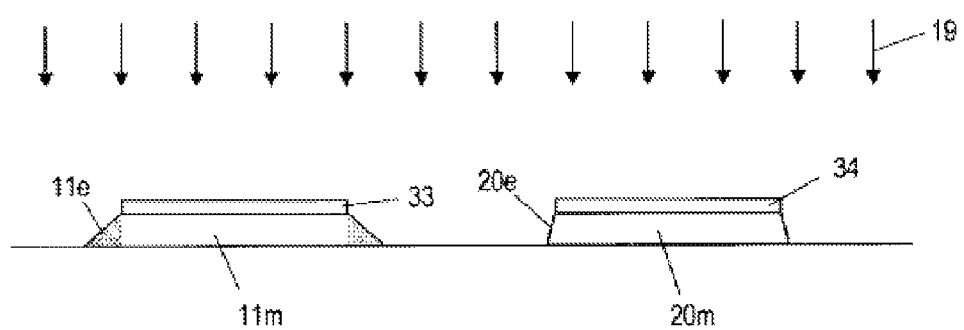
Figure 14:
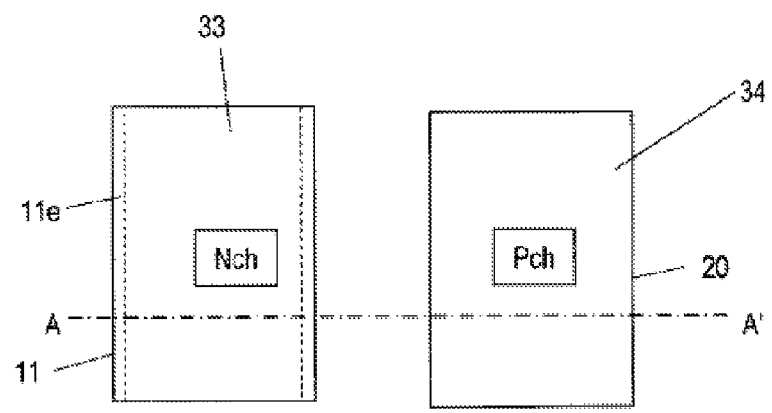
FIGS. 14(a) and 14(b) are a plan view and a cross-sectional view that schematically illustrate a method of manufacturing the semiconductor device according to Embodiment 2 of the present invention, respectively.
Figure 14:
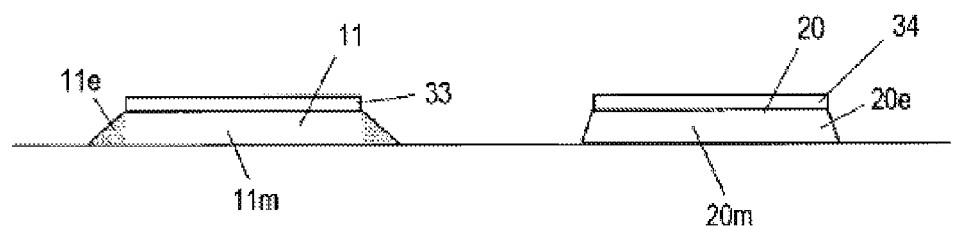

FIGS. 10(a) and 10(b) respectively show examples of the voltage-current characteristics of the n-type TFT 100 and the p-type TFT 200 of Embodiment 2. As is clear from the comparison with the characteristics described above using FIG. 20, in both the n-type TFT 100 and the p-type TFT 200 of the present embodiment, when the ON current drives up, the two-step change does not appear in the voltage-current characteristics, unlike the characteristics shown in FIG. 20. This makes it possible to reduce the source-drain voltages Tn and Tp of the n-type TFT 100 and the p-type TFT 200 upon the gate voltage being 0V, allowing for a reduction in the threshold voltages for turning off the TFTs.

Next, an overview of a method of manufacturing the semiconductor device of the present embodiment will be explained with reference to FIGS. 11 to 14.

In each of FIGS. 11 to 14, (a) is a plan view showing regions of the semiconductor layers 11 and 20, and (b) is a cross-sectional view along the line A-A' in the plan view in (a). The line A-A' is parallel with the channel width direction. The base insulating film 2 is not shown in the figures.

First, on a semiconductor film, a first mask film made of silicon oxide, for example, is formed, and on the first mask film, mask films 13 and 14 made of a resist are formed. Next, using the mask films 13 and 14 as masks, the first mask film and the semiconductor film are patterned. As a result, as shown in FIGS. 11(a) and 11(b), a multi-layer structure made of the semiconductor layer 11, the mask film 33, and the mask film 13, and a multi-layer structure made of a semiconductor layer 20p, the mask film 34, and the mask film 14 are obtained. At this point, the semiconductor layer 11 has been patterned into a shape (final shape) of the active layer of the n-type TFT 100.

Next, the semiconductor layer 11 and the mask film 33 are covered by a mask film 15, and the semiconductor layer 20p and the mask film 34 are patterned using a mask film 16. As a result, as shown in FIGS. 12(a) and 12(b), a multi-layer structure made of the semiconductor layer 20, the mask film 34, and the mask film 16 is obtained. At this point, the semiconductor layer 20 has been patterned into a shape (final shape) of the semiconductor layer 20 of the p-type TFT. The inclination angle $\theta_2$ of the edge face of the semiconductor layer 20 is made larger than the inclination angle $\theta_1$ of the edge face of the semiconductor layer 11.

Next, after removing the mask films 15 and 16, as shown in FIGS. 13(a) and 13(b), a p-type impurity (boron, for example) is implanted into the semiconductor layer 11 and the semiconductor layer 20 from above, using the mask films 33 and 34 as masks, respectively. The mask films 33 and 34 are formed on the main portions 11m and 20m of the semiconductor layer 11 and the semiconductor layer 20, and therefore, the p-type impurity is implanted only into the edge portion 11e of the semiconductor layer 11 and the edge portion 20e of the semiconductor layer 20. Because the edge portion 20e has a smaller exposed area, the amount of impurity that is implanted into the edge portion 20e is significantly smaller than that of the edge portion 11e.

In this way, as shown in FIGS. 14(a) and 14(b), the semiconductor layers 11 and 20 are completed. The edge portion 11e of the semiconductor layer 11 is doped with the sufficient amount of p-type impurity, and the amount of the p-type impurity doped into the edge portion 20e of the semiconductor layer 20 is significantly small. Therefore, in both of the n-type TFT 100 and the p-type TFT 200, respectively, the negative effects of the parasitic transistors resulting from the edge portions 11e and 20e are suppressed.

Below, with reference to figures, the method of manufacturing the semiconductor device of the present embodiment will be explained more specifically.

FIGS. 15(a) to 15(g) are process cross-sectional views for explaining an example of the method of manufacturing the semiconductor device of the present embodiment, respectively. These drawings show cross-sections along the channel width direction.

As shown in FIG. 15(a), first, a base film 2a and a base film 2b are formed on the substrate 1 by the plasma CVD method or the like, and thereafter, a crystalline semiconductor film 30 is formed thereon so as to cover a wide area on the substrate 1. The base film 2a and the base film 2b constitute the base insulating film 2.

Next, on the crystalline semiconductor film 30, a first mask film 35 is formed of silicon oxide or the like, and on the first mask film 35, the mask films 13 and 14 made of a resist are formed by photolithography.

Thereafter, as shown in FIG. 15(b), by etching the first mask film 35 and the crystalline semiconductor film 30 into island shaped layers using the mask films 13 and 14 as masks, the semiconductor layer 11, which later becomes an active layer of the n-type TFT 100, the mask film 33 on the semiconductor layer 11, the semiconductor layer 20p that includes the semiconductor layer 20, which later becomes an active layer of the p-type TFT 200, and the mask film 34 on the semiconductor layer 20p are obtained.

The crystalline semiconductor film 30 and the first mask film 35 are etched by using a mixed gas that is obtained by appropriately mixing a plurality of types of gases such that the side faces of the edge portions of the semiconductor layers 11 and 20p, which are formed as a result of the etching, are inclined at an angle of 30 to 45° relative to the plane of the substrate 1. In the present embodiment, the etching is performed by the RIE (reactive ion etching) method using an etching gas that is obtained by mixing tetrafluoromethane ($CF_4$) and oxygen ($O_2$) with a ratio of 8:2, for example.

Next, as shown in FIG. 15(c), the semiconductor layer 11 and the mask film 33 are covered by the mask film 15 that is made of a photoresist, and the mask film 16 is formed on the semiconductor layer 20p and the mask film 34. The mask film 16 is formed with a smaller width than that of the semiconductor layer 20p and the mask film 34.

Next, the semiconductor layer 20p and the mask film 34 are etched, using the mask film 16 as a mask. As a result, as shown in FIG. 15(d), the semiconductor layer 20, which later becomes the active layer of the p-type TFT, and the mask film 34 on the semiconductor layer 20 are obtained. The semiconductor layer 20p and the mask film 34 are etched by using a mixed gas that is obtained by appropriately mixing a plurality of types of gases such that the side face of the edge portion of the semiconductor layer 20, which is formed as a result of the etching, is inclined at an angle of 45 to 60° relative to the plane of the substrate 1. In the present embodiment, the etching is performed by the RIE method using an etching gas that is obtained by mixing tetrafluoromethane ($CF_4$) and oxygen ($O_2$) with a ratio of 9:1, for example.

Next, as shown in FIG. 15(e), the mask films 15 and 16 are removed, and the mask films 33 and 34 and the edge portions of the semiconductor layers 11 and 20 are exposed.

Next, in this state, as shown in FIG. 15(f), a low-concentration p-type impurity 19 is doped from above the substrate surface. Here, boron is used as the p-type impurity 19. As the boron injection conditions in this doping, the acceleration voltage is set to 5 to 20 kV, and the dosage is set to $5\times10^{11}$ to $1\times10^{13}$ $cm^{-2}$, for example. This way, the p-type impurity 19 is implanted into the portions (slanted portions) 11e and 20e only, which are exposed from the mask films 33 and 34 in the semiconductor layers 11 and 20. The p-type impurity 19 is not implanted into portions (main portions) 11m and 20m that are covered by the mask films 33 and 34 in the semiconductor layers 11 and 20.

Because the inclination angle of the side face of the semiconductor layer 11 is smaller than the inclination angle of the side face of the semiconductor layer 20, the volume of the slanted portion 11e is larger than the volume of the slanted portion 20e. Therefore, the amount of the p-type impurity 19 that is doped into the edge portion of the semiconductor layer 11 is greater than the amount of the p-type impurity 19 that is doped into the edge portion of the semiconductor layer 20. Therefore, this doping affects the semiconductor layer 11, but not the semiconductor layer 20 almost at all.

Next, as shown in FIG. 15(g), the gate insulating film 3 and the gate electrode film 7 are formed on the semiconductor layers 11 and 20 and the mask films 33 and 34. The mask films 33 and 34 may be removed before forming the gate electrode film 7.

Next, although not shown in this cross-sectional view, the source and drain regions of the semiconductor layer 11 are formed by doping the p-type impurity therein. Similarly, the source and drain regions of the semiconductor layer 20 are formed by doping the n-type impurity therein. Next, on the gate electrode film 7, the first interlayer insulating film 4 is formed. In this configuration, the first interlayer insulating film 4 has a two-layered structure of an insulating film 4a made of silicon nitride and an insulating film 4b made of silicon oxide.

Further, although not shown in this cross-sectional view, on the first interlayer insulating film 4, source electrodes and drain electrodes of the respective TFTs are disposed. As shown in FIG. 9(d), the source electrodes are connected to the source regions of the respective TFTs through contact holes formed in the first interlayer insulating film 4 and the gate insulating film 3. Similarly, the drain electrodes are connected to the drain regions of the respective TFTs through contact holes formed in the first interlayer insulating film 4 and the gate insulating film 3. This way, the n-type TFT 100 and the p-type TFT 200 are obtained.

Next, the second interlayer insulating film 6 that is a resin layer is formed so as to cover the n-type TFT 100 and the p-type TFT 200. Also, in the present embodiment, an electrode film 8 that becomes a pixel electrode is formed on the second interlayer insulating film 6. As shown in FIG. 9(d), the electrode film 8 is electrically connected to the drain electrode of the n-type TFT and the source electrode of the p-type TFT through a contact hole formed in the second interlayer insulating film 6.

Figure 15:
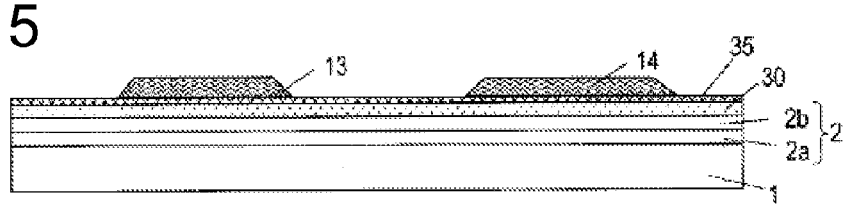
FIGS. 15(a) to 15(g) are process cross-sectional views that respectively illustrate an example of a method of manufacturing the semiconductor device according to Embodiment 2 of the present invention.
Figure 15:
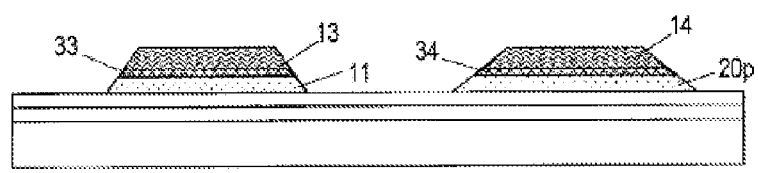
Figure 15:
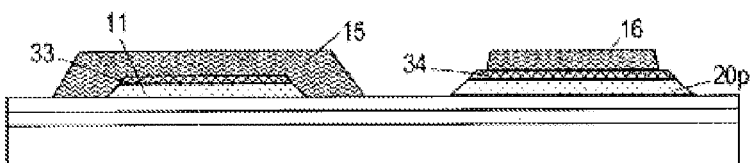
Figure 15:
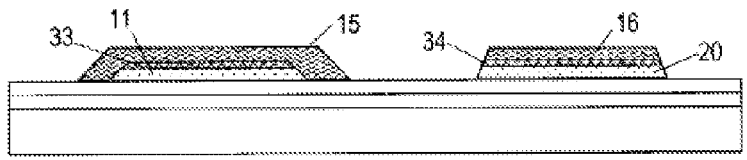
Figure 15:
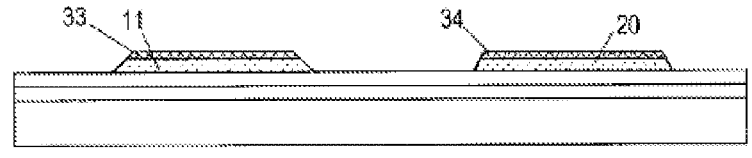
Figure 15:
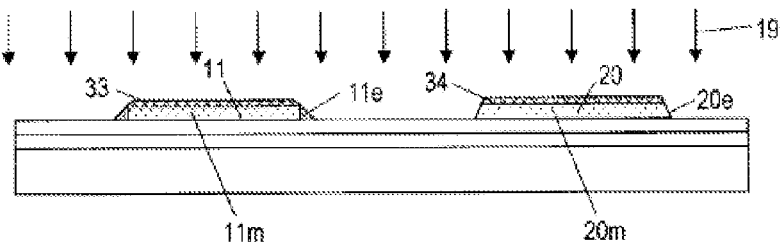
Figure 15:
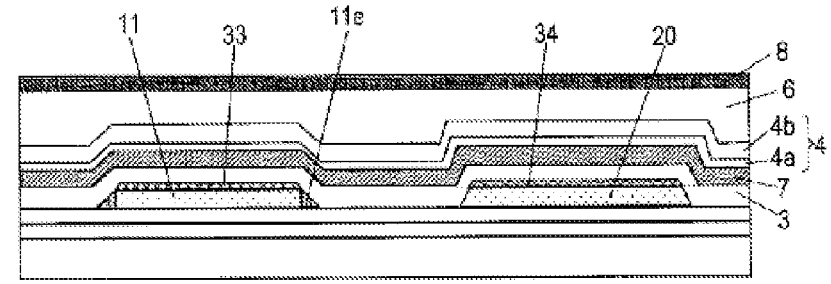

In the process shown in FIG. 15, the semiconductor layer 11 of the n-type TFT 100 was formed before the semiconductor layer 20 of the p-type TFT 200, but the semiconductor layer 11 may be formed after the semiconductor layer 20. Also, if necessary, a p-type impurity may be doped into the semiconductor layers 11 and 20 of the respective TFTs (channel-doping) in the middle of the process so as to control the threshold voltages Vth of the n-type TFT 100 and of the p-type TFT 200 separately. In the channel-doping, the concentrations of the p-type impurity in the main portions of the semiconductor layers 11 and 20 may be made to differ from each other by selectively performing the channel-doping to one of the semiconductor layers 11 and 20, or by performing the channel-doping to the two semiconductor layers separately.

According to the manufacturing method of the present embodiment, it is possible to adjust the voltage-current characteristics of both of the n-type TFT 100 and the p-type TFT 200 with the single doping. This allows for a reduction in the threshold voltages of the two TFTs without making the manufacturing process complex. Also, because the mask films 33 and 34 can be used as masks when doping the p-type impurity 19, it is not necessary to form new masks for the doping, and therefore, the manufacturing efficiency is improved.

In the conventional method shown in FIG. 21, when the p-type impurity is implanted into the slanted portion of the n-type TFT, the entire p-type TFT needs to be covered by a resist film, and therefore, the resist film on the slanted portion of the p-type TFT is exposed to the impurity doping at a higher concentration than normal. This may cause the property of the resist film to change, and consequently, the resist film on the slanted portion cannot be removed, which possibly results in a problem of defects in the TFT characteristics or the contamination of the apparatus.

According to the manufacturing method of the present invention, because the slanted portions of the respective semiconductor layers are not covered by a resist when the p-type impurity is doped, even after the high-concentration impurity was doped, the resist can be removed with ease by a normal method such as plasma ashing. This makes it possible to suppress or prevent the defects in characteristics, the apparatus contamination, and the like, which result from the change in the resist property and the residual resist.

In the conventional method, the gate insulating film formed on the planarized portions of the semiconductor layers is made of two layers of the mask layers and the insulating film formed thereon. In order to minimize the threshold voltages Vth of the TFTs, it is necessary to reduce the thickness of the gate insulating film, however, with the conventional method, because the gate insulating film needs to have two layers, the thickness thereof cannot be reduced to a sufficient level.

In the conventional method, if the mask layers are removed, instead of being used as the gate insulating film, the thickness of the gate insulating film could be reduced, but it would create a need for a removal step of the two mask layers, in addition to the forming step thereof, thereby increasing the number of process steps. In addition, in removing the mask layers, the base insulating film that is made of the same silicon oxide film as the mask layers is also etched. This may result in a problem of a step being formed in the base insulating film at the edge portions of the semiconductor layers, which makes defects such as disconnections of gate wiring more likely to occur. According to the manufacturing method of the present invention, it is possible to prevent such a problem from occurring.

With the method described in Patent Document 1, the "hump" resulting from the parasitic transistor of the n-type TFT can be prevented from appearing, but because the thickness of gate insulating film cannot be reduced, it is difficult to sufficiently reduce the threshold voltage Vth.

According to the present embodiment, it is not necessary to form the gate insulating film that has a two-layer structure on the semiconductor layers. This allows for a significant reduction in the thickness of the gate insulating film, and therefore, it becomes possible to sufficiently reduce the threshold voltage Vth. Also, in the etching step of the semiconductor layer, the sufficient etching select ratio between the semiconductor layer and the base film can be ensured. Therefore, it is possible to prevent the surface layer portion of the base film from being etched together with the semiconductor layer, thereby preventing steps between the semiconductor layer pattern and the base film in the vicinity thereof from being made larger. Because this allows the gate insulating film to cover the steps more reliably, there is no need to form a thick gate insulating film. As a result, the threshold voltage Vth can be sufficiently reduced.

According to the present embodiment, the thickness of the gate insulating film 3 can be selected with a higher degree of freedom, and therefore, it is possible to obtain the thickness that is most suited for the device to be provided. This makes it possible to effectively reduce the threshold voltages Vth of the respective TFTs, and as a result, the driving voltage of the semiconductor device can be further reduced.

Embodiment 3

A semiconductor device according to Embodiment 3 of the present invention will be explained. The present embodiment differs from Embodiment 1 above in that semiconductor layers of an n-type TFT 300 and a p-type TFT 400 have a pattern in which the channel width is narrower than the widths of source/drain regions (so-called "dog bone pattern"). However, other than that, the present embodiment is basically the same as Embodiment 1. The same reference characters are given to constituting elements that are the same or that have the same functions as those of Embodiment 1, and the detailed descriptions thereof are omitted.

In Embodiments 1 and 2, the island-shaped semiconductor layers that are used as the active layers of the n-type TFT 100 and the p-type TFT 200 have a rectangular pattern. However, the actual circuit, especially the memory circuit provided in a pixel such as an SRAM circuit or a DRAM circuit, often uses an island-shaped semiconductor that is patterned to have a narrower channel width. In this case, in the island-shaped semiconductor layer, the width of the channel region is made smaller than the width in the channel width direction of regions where contact holes are formed. That is, the semiconductor layer is patterned to have a neck portion between the source region and the drain region. The "neck portion" refers to a portion that has a smaller width than the width of other portions. In the present specification, the pattern having the neck portion is referred to as the "dog bone pattern."

Figure 16:
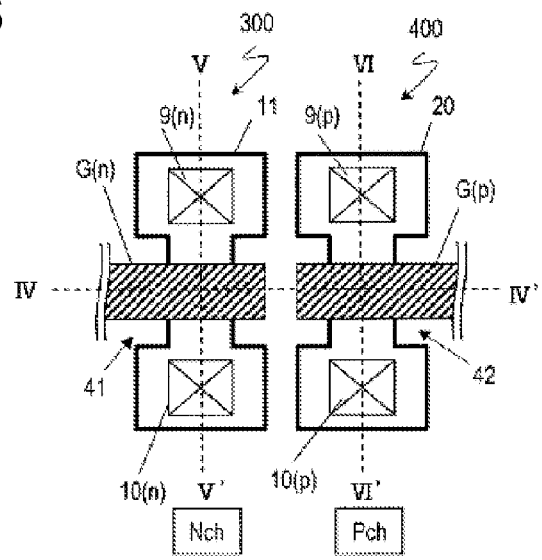
FIG. 16(a) is a plan view that schematically shows an n-type TFT and a p-type TFT in a semiconductor device according to Embodiment 3 of the present invention.
FIG. 16(b) is a cross-sectional view along the line IV-IV' in the plan view in FIG. 16(a).
FIGS. 16(c) and 16(d) are cross-sectional views along the line V-V' and the line VI-VI' in the plan view in FIG. 16(a), respectively.
Figure 16:
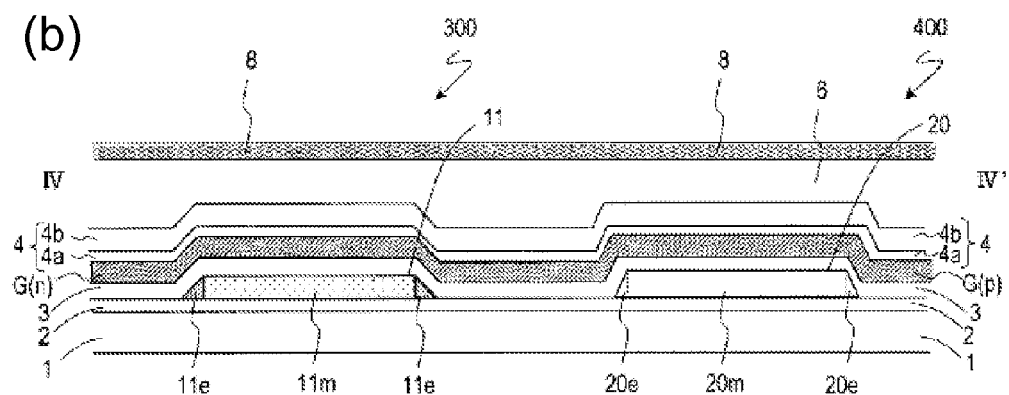
Figure 16:
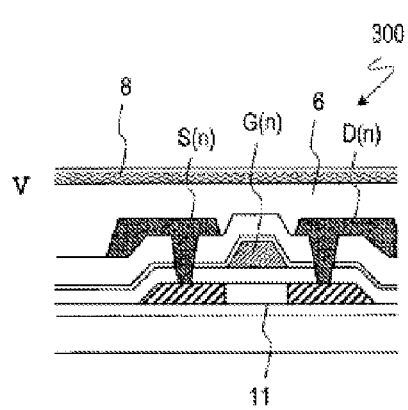
Figure 16:
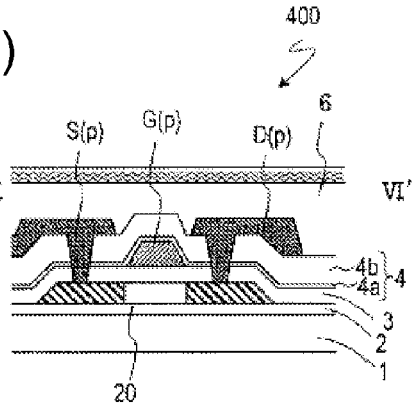

FIG. 16(a) is a plan view that schematically shows an n-type TFT and a p-type TFT in a semiconductor device of the present embodiment. FIG. 16(b) is a cross-sectional view along the line IV-IV' in the plan view in FIG. 16(a). FIGS. 16(c) and 16(d) are cross-sectional views along the line V-V' and the line VI-VI' in the plan view in FIG. 16(a), respectively. The line V-V' and the line VI-VI' are perpendicular to the channel direction, and the line IV-IV' is parallel with the channel direction.

The semiconductor device of the present embodiment includes the n-type TFT 300 and the p-type TFT 400. The n-type TFT 300 has a semiconductor layer 11 that includes source and drain regions and a channel region located therebetween. The source and drain regions are respectively connected to a source electrode and a drain electrode disposed above the semiconductor layer 11 through contact portions 9(n) and 10(n). On the semiconductor layer 11, a gate electrode G(n) is disposed so as to overlap the channel region. In a top view of the substrate 1, the semiconductor layer 11 is patterned so as to have a neck portion 41 between the source region and the drain region (FIG. 16(a)). The width of the neck portion 41 in the channel width direction is smaller than the maximum width of the source and drain regions in the channel width direction. The channel region is formed in the neck portion 41.

In a manner similar to the n-type TFT 300, the p-type TFT 400 has a semiconductor layer 20 that includes source and drain regions and a channel region located therebetween. The source and drain regions are respectively connected to a source electrode and a drain electrode disposed above the semiconductor layer 20 through contact portions 9(p) and 10(p). On the semiconductor layer 20, a gate electrode G(p) is disposed so as to overlap the channel region. In a top view of the substrate 1, the semiconductor layer 20 is patterned so as to have a neck portion 42 between the source region and the drain region. The channel region is formed in the neck portion 42.

In the semiconductor layers 11 and 20 of the n-type TFT 300 and the p-type TFT 400, the width of the neck portions 41 and 42 is the channel width W. When the semiconductor device of the present embodiment is used for a memory circuit that is built in a pixel, for example, it is preferable that the channel width W be made small so as to minimize a leak current in the off operation, which can reduce current consumption. The channel width W is about 3 to 4 μm, for example. On the other hand, the width in the channel width direction of regions where the contact portions are disposed in the source and drain regions is larger than the width of contact holes (4 μm, for example), and is set to 8 μm, for example.

In the present embodiment, the semiconductor layers 11 and 20 respectively have slanted portions 11e and 20e and main portions 11m and 20m. In the slanted portion 11e of the n-type TFT 300, at least a portion thereof that overlaps the gate electrode G(n) is doped with a p-type impurity at a higher concentration than that of the main portion 11m of the semiconductor layer 11. In the example shown in the figure, in the slanted portion 11e of the semiconductor layer 11, the concentration of the p-type impurity in a portion that is located in the neck portion is higher than the concentration of p-type impurity in the main portion 11m. In the slanted portion 20e of the semiconductor layer 20, the concentration of the p-type impurity in at least a portion thereof that overlaps the gate electrode G(p) is higher than the concentration of p-type impurity in the main portion 20m. In the example shown in the figure, in the slanted portion 20e of the semiconductor layer 20, the concentration of the p-type impurity in a portion that is located in the neck portion is higher than the concentration of p-type impurity in the main portion 20m.

In the slanted portion 11e of the semiconductor layer 11, a part that does not overlap the gate electrode G(n) may be doped with the p-type impurity at high concentration that is substantially the same level as that in the main portion 11m. In the slanted portion 20e of the semiconductor layer 20, a part that does not overlap the gate electrode G(p) may be doped with the p-type impurity at high concentration that is substantially the same level as that in the main portion 20m.

The shapes of the slanted portions 11e and 20e of the semiconductor layers 11 and 20 are the same as those described above using FIG. 2. Therefore, it is also possible with Embodiment 3 to sufficiently reduce the parasitic transistor component that results from the slanted portion 11e of the semiconductor layer 11, while eliminating the effect of the parasitic transistor component that results from the slanted portion 20e of the semiconductor layer 20 almost completely.

As described above, the semiconductor device of the present embodiment has the same configuration as that of the semiconductor device of Embodiment 1, except for the neck portions 41 and 42. Therefore, according to the present embodiment, advantages and effects similar to those described in Embodiment 1 can be obtained. A manufacturing method of the present embodiment is the same as the manufacturing method described in Embodiment 1 except that masks corresponding to the neck portions 41 and 42 are used, and therefore, the description thereof is omitted.

The mask films 33 and 34 may be added to the semiconductor device of the present embodiment in the same manner as Embodiment 2. The configuration and the manufacturing method in such a case are the same as those described in Embodiment 2 except for the neck portions 41 and 42. Advantages and effects that can be obtained are also the same as those in Embodiment 2.

Embodiment 4

Embodiment 4 of the present invention will be explained below. The present embodiment is an active matrix liquid crystal display device. In an active matrix substrate of the liquid crystal display device of the present embodiment, a driver circuit that includes the n-type TFTs 100 and 300 and the p-type TFTs 200 and 400, which were described in Embodiments 1 to 3, is integrally formed (monolithic driver). The semiconductor device of the present invention includes a device that is provided with an active matrix substrate and a circuit that includes the n-type and p-type TFTs, which will be described below. The semiconductor device of the present invention also includes a display device that is provided with a substrate, a circuit, a pixel, and the like that include n-type TFTs and p-type TFTs described below.

Figure 17:
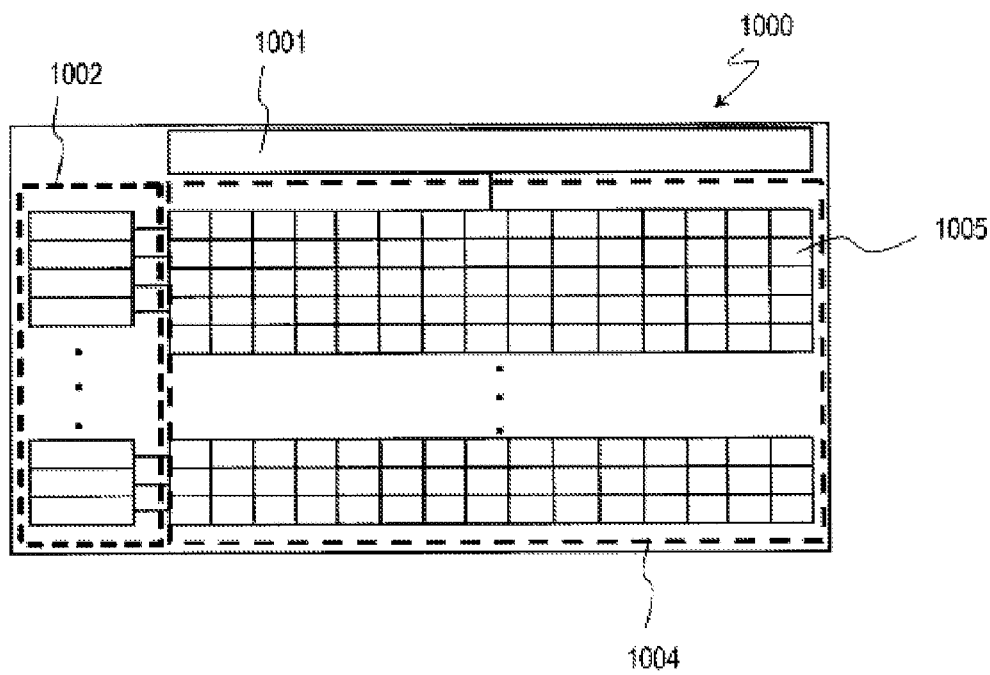
FIG. 17(a) is a plan view that schematically shows an active matrix substrate 1000 in which driver circuits are integrally formed.
FIG. 17(b) is a diagram that schematically shows a structure of a single pixel.
Figure 17:
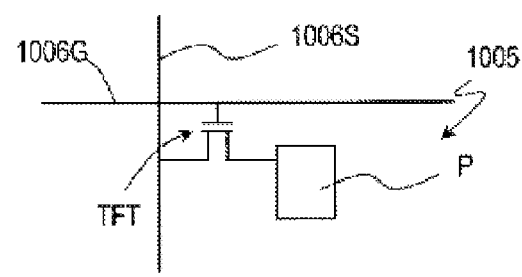

FIG. 17(a) is a schematic plan view showing an active matrix substrate 1000 in the liquid crystal display panel of the present embodiment. FIG. 17(b) schematically shows a structure of a single pixel. FIG. 17(a) shows a structure of the active matrix substrate 1000, and a liquid crystal layer or an opposite substrate is not shown. A liquid crystal display device can be obtained by providing a backlight, a power source, and the like to a liquid crystal display panel formed by using this active matrix substrate 1000.

The active matrix substrate 1000 has a frame region where a gate driver 1002 and a source driver 1001 are disposed and a display region 1004 where a plurality of pixels are arranged. The reference character 1005 represents regions corresponding to respective pixels in the active matrix substrate 1000. The source driver 1001 does not necessarily have to be formed in the active matrix substrate 1000 integrally, and a source driver IC or the like that is separately fabricated may be mounted by a known method.

As shown in FIG. 17(b), the active matrix substrate 1000 has pixel electrodes P each of which corresponds to a single pixel in the liquid crystal display panel. The pixel electrode P is connected to a source bus line 1006S through a TFT for pixel switching. The gate electrode of the TFT is connected to a gate bus line 1006G.

The gate bus lines 1006G are connected to outputs of the gate driver 1002, respectively, and are scanned in a line-sequential manner. The source bus lines 1006S are connected to outputs of the source driver 1001, and are supplied with display signal voltages (gradation voltages).

The source driver 1001 and the gate driver 1002 are provided with a plurality of CMOS for high-speed driving. At least one of the gate driver 1002 and the source driver 1001 may be provided with a shift register that is constituted of CMOS, for example. In the present embodiment, at least one of these CMOS includes an n-type TFT and a p-type TFT that have the same configurations as those in one of Embodiments 1 to 3.

Figure 18:
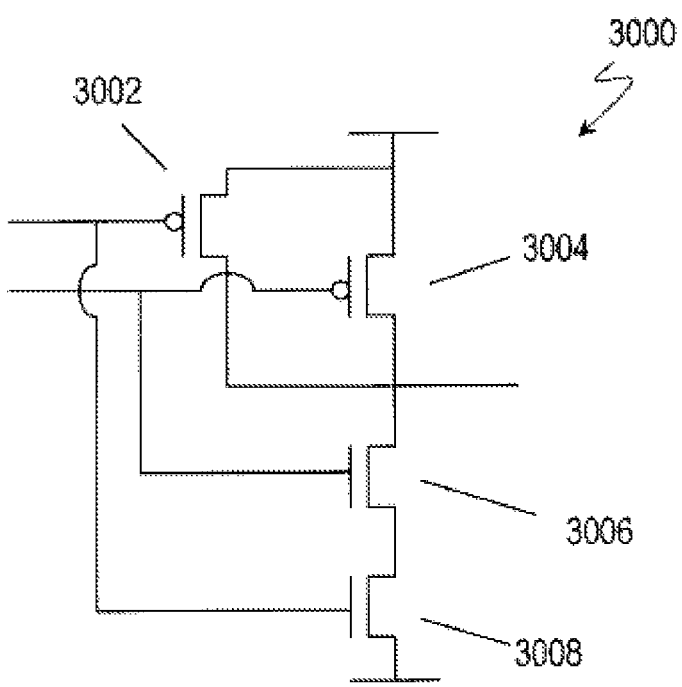
FIG. 18 is a diagram showing an example of a circuit in each pixel in a display device that has a memory circuit provided in each pixel.

As an example of a circuit that uses CMOS, an NAND circuit is shown in FIG. 18. The TFTs described in one of the embodiments above can be used as p-type TFTs 3002 and 3004 and n-type TFTs 3006 and 3008 that are used in an NAND circuit 3000.

The semiconductor device of the present embodiment may be a liquid crystal display device having a memory circuit in each pixel. In such a liquid crystal display device, each pixel is provided with a switching transistor, a pixel electrode, a memory circuit that stores an image signal inputted to the pixel electrode through the switching transistor, and a liquid crystal cell that is driven to perform display in accordance with the inputted image signal. The signal voltage that is stored in the memory circuit is constantly applied to the liquid crystal cell of that pixel. Therefore, as long as the same still image is to be displayed, the display on the screen can be maintained using the signal voltage stored in the memory circuit, and it is not necessary to input an image signal to the display device from the outside.

Figure 19:
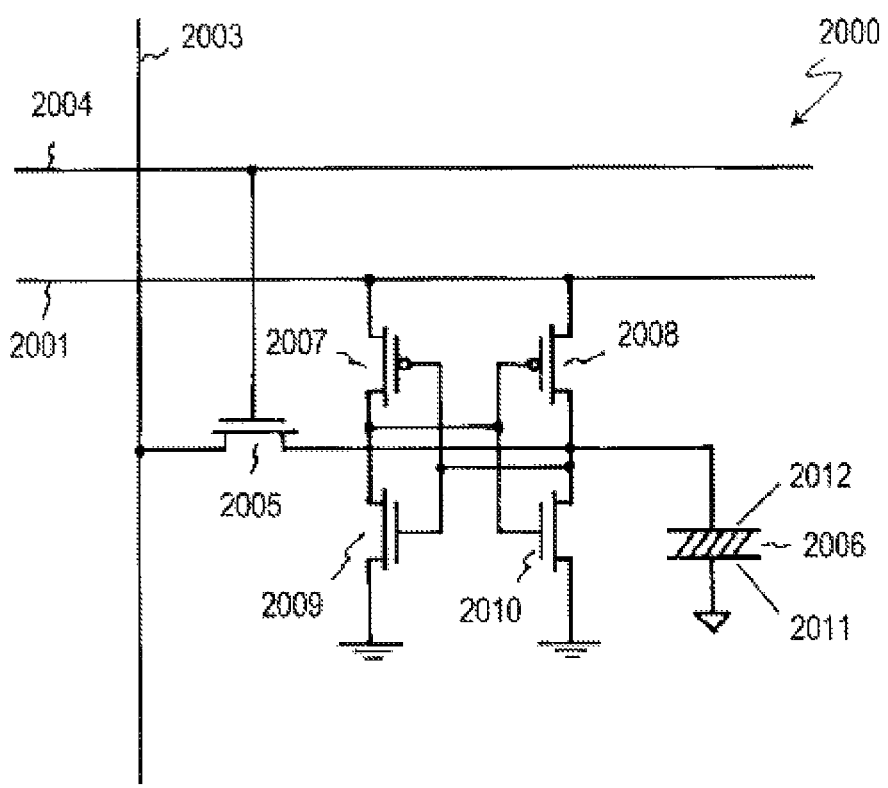
FIG. 19 is a diagram showing an example of a circuit that uses a CMOS (NAND circuit).

FIG. 19 is an example of a circuit of each pixel 2000 in the semiconductor device of the present embodiment.

Each pixel 2000 in the semiconductor device of the present embodiment is provided with an n-type transistor 2005 that is connected to a source line 2003 and a gate line 2004 and a memory circuit that stores an image signal inputted to this pixel through the transistor 2005. The memory circuit is an SRAM circuit that is constituted of p-type transistors 2007 and 2008 and n-type transistors 2009 and 2010. The p-type transistor 2007 and the n-type transistor 2009 that constitute the SRAM circuit are arranged adjacently to each other, and have the same configurations as those in one of the embodiments above. Similarly, the p-type transistor 2008 and the n-type transistor 2010 are arranged adjacently to each other, and have the same configurations as those in one of the embodiments above.

In the transistor 2005, the gate terminal is connected to the gate line 2004 of the liquid crystal display device, the drain terminal is connected to the source line 2003 of the liquid crystal display device, and the source terminal is connected to the memory circuit. Wiring 2001 is a power supply line of the memory circuit, and is set to a voltage value that is to be charged to a liquid crystal 2006.

A signal voltage supplied from the source line 2003 is applied to an electrode 2012 provided in the liquid crystal 2006, and the liquid crystal 2006 is applied with an electric field that corresponds to a potential difference between the electrode 2012 and an opposite electrode 2011.

Next, an operation of the circuit shown in FIG. 19 will be explained. For a period of 1/(30×number of scanning lines) seconds or 1/(60×number of scanning lines) seconds, a voltage pulse is applied to the gate line 2004, which turns the transistor 2005 on. During that period, an image signal from the source line 2003 is charged to the liquid crystal 2006 and the gate of the transistor 2009. If the image signal is ON voltage (high voltage), an electric field is applied to the liquid crystal 2006, which changes the orientation thereof. Also, the transistor 2009 is turned on, and the transistor 2010 is turned off. When the voltage of the gate line 2004 becomes OFF voltage (low voltage), the transistor 2005 is turned off. However, because the liquid crystal 2006 is charged through the transistor 2008, the orientation thereof does not change. When OFF voltage (low voltage) is inputted from the source line 2003 during a period in which the transistor 2005 is in the ON state, an electric field is not applied to the liquid crystal 2006, the transistor 2009 is turned off, and the transistor 2010 is turned on. Even after the transistor 2005 was turned off, because the liquid crystal 2006 discharges an electrical current through the transistor 2010 in the ON state, the electric field is not applied thereto.

In the example shown in FIG. 19, the SRAM circuit having a simple configuration is used as the memory circuit, but the configuration of the SRAM circuit is not limited to such. In the example shown in the figure, the SRAM circuit includes four TFTs, but a greater number of TFTs may be provided. It is also possible to use a DRAM circuit instead of the SRAM circuit.

INDUSTRIAL APPLICABILITY

The application range of the present invention is very broad, and it is possible to apply the present invention to semiconductor devices equipped with n-type TFTs and p-type TFTs and to electronic devices in all fields for which such semiconductor devices are used. A CMOS circuit that is formed by implementing the present invention can be used for a peripheral circuit of a display device such as an active matrix liquid crystal display device or an organic EL display device, for example. The present invention can also be suitably used for a display device that has a memory circuit in each pixel. Such a display device can be used for a display screen of a mobile phone or a portable gaming device, a monitor of a digital camera, or the like, for example. The present invention can be used for an electronic device that has a liquid crystal display device or an organic EL display device incorporated therein.

DESCRIPTIONS OF REFERENCE CHARACTERS 1 substrate
1a substrate plane
2 base insulating film
2a, 2b base film
3 gate insulating film
4 first interlayer insulating film
4a, 4b insulating film
6 second interlayer insulating film
7 gate electrode film
8 electrode film
9(n), 9(p), 10(n), 10(p) contact portion
11 semiconductor layer of n-type TFT
20 semiconductor layer of p-type TFT
11a, 20a upper surface of semiconductor layer
11b, 20b lower surface of semiconductor layer 11e, 20e slanted portion of semiconductor layer
11m, 20m main portion of semiconductor layer
11s, 20s side face of semiconductor layer
30 crystalline semiconductor film
35 first mask film
100 n-type TFT
200 p-type TFT
G(n), G(p) gate electrode
S(n), S(p) source electrode
D(n), D(p) drain electrode

The invention claimed is:

1. A semiconductor device that has a first thin film transistor of n-channel type and a second thin film transistor of p-channel type on a face of a single substrate,
wherein the first thin film transistor comprises: a first semiconductor layer that has a first channel region, a first source region, and a first drain region; a first gate electrode disposed above the first channel region; and a gate insulating film disposed between the first semiconductor layer and the first gate electrode,
wherein the second thin film transistor comprises: a second semiconductor layer that has a second channel region, a second source region, and a second drain region; a second gate electrode disposed above the second channel region; and a gate insulating film disposed between the second semiconductor layer and the second gate electrode,
wherein the first semiconductor layer has a main portion that is sandwiched by a upper surface and a lower surface of the first semiconductor layer and a slanted portion that is sandwiched by a side face and the lower surface of the first semiconductor layer,
wherein the second semiconductor layer has a main portion that is sandwiched by a upper surface and a lower surface of the second semiconductor layer and a slanted portion that is sandwiched by a side face and the lower surface of the second semiconductor layer, and
wherein an inclination angle of the side face of the second semiconductor layer relative to a plane of the substrate is larger than an inclination angle of the side face of the first semiconductor layer.

2. The semiconductor device according to claim 1, wherein the inclination angle of the side face of the first semiconductor layer is 30° or greater and 45° or smaller.

3. The semiconductor device according to claim 1, wherein the inclination angle of the side face of the second semiconductor layer is 45° or greater and 60° or smaller.

4. The semiconductor device according to claim 1, wherein a volume of the slanted portion of the first semiconductor layer is larger than a volume of the slanted portion of the second semiconductor layer.

5. The semiconductor device according to claim 1, wherein the slanted portion of the first semiconductor layer is doped with a p-type impurity.

6. The semiconductor device according to claim 1, wherein the first and second semiconductor layers are obtained by patterning a same semiconductor film.

7. The semiconductor device according to claim 1, wherein, when viewed from a normal direction to the plane of the substrate, the slanted portion of the first semiconductor layer is extended in a same direction as a direction in which the first channel region is extended, and the slanted portion of the second semiconductor layer is extended in a same direction as a direction in which the second channel region is extended.

8. The semiconductor device according to claim 1, wherein a mask film is formed between the main portion of the first semiconductor layer and the first gate electrode, and a mask film is formed between the main portion of the second semiconductor layer and the second gate electrode.

9. The semiconductor device according to claim 1, wherein, when viewed from a normal direction to the plane of the substrate, the first semiconductor layer has a first neck portion located between the first source region and the first drain region, and the second semiconductor layer has a second neck portion located between the second source region and the second drain region, and
wherein the slanted portion of the first semiconductor layer is included in the first neck portion, and the slanted portion of the second semiconductor layer is included in the second neck portion.

10. The semiconductor device according to claim 1, further comprising an SRAM circuit,
wherein the SRAM circuit has the first thin film transistor and the second thin film transistor.

11. A display device, comprising a plurality of pixels,
wherein each pixel comprises a pixel electrode and a memory circuit that is connected to the pixel electrode and that stores an image signal, and
wherein the memory circuit includes the SRAM circuit according to claim 10.

12. A method of manufacturing a semiconductor device that has a first thin film transistor of n-channel type and a second thin film transistor of p-channel type on a face of a single substrate, the method comprising:
(a) forming a semiconductor film on the substrate;
(b) forming a first semiconductor layer that becomes an active region of the first thin film transistor by etching the semiconductor film using a first mask film as a mask, the first semiconductor layer including a main portion that is covered by the first mask film and a slanted portion that is located in a periphery of the first semiconductor layer and that is not covered by the first mask film;
(c) forming a second semiconductor layer that becomes an active region of the second thin film transistor by etching the semiconductor film using a second mask film as a mask, the second semiconductor layer including a main portion that is covered by the second mask film and a slanted portion that is located in a periphery of the second semiconductor layer and that is not covered by the second mask film; and
(d) covering each of the main portions of the first semiconductor layer and the second semiconductor layer with a mask, and implanting a p-type impurity selectively into the slanted portion of the first semiconductor layer and the slanted portion of the second semiconductor layer,
wherein an inclination angle of a side face of the slanted portion of the second semiconductor layer, which is formed in the step (c), relative to a plane of the substrate is larger than an inclination angle of a side face of the slanted portion of the first semiconductor layer, which is formed in the step (b).

13. The method of manufacturing a semiconductor device according to claim 12, wherein the inclination angle of the side face of the first semiconductor layer, which is formed in the step (b), is 30° or greater and 45° or smaller.

14. The method of manufacturing a semiconductor device according to claim 12, wherein the inclination angle of the side face of the second semiconductor layer, which is formed in the step (c), is 45° or greater and 60° or smaller.

15. The method of manufacturing a semiconductor device according to claim 12, wherein a volume of the slanted portion of the first semiconductor layer, which is formed in the step (b), is larger than a volume of the slanted portion of the second semiconductor layer, which is formed in the step (c).

16. The method of manufacturing a semiconductor device according to claim 12, wherein, in the step (c), the first semiconductor layer is entirely covered by a mask, and the first semiconductor layer is not etched.

17. The method of manufacturing a semiconductor device according to claim 12, further comprising, prior to the step (d), removing the first and second mask films, and covering each of the main portions of the first semiconductor layer and the second semiconductor layer with another mask.

18. The method of manufacturing a semiconductor device according to claim 12, further comprising, prior to the steps (b) to (d), forming a third mask film on the semiconductor film, wherein, in the step (b), the semiconductor film and the third mask film are etched, and a multi-layer structure of the first semiconductor layer and the third mask film is formed, wherein, in the step (c), the semiconductor film and the third mask film are etched, and a multi-layer structure of the second semiconductor layer and the third mask film is formed, and wherein, in the step (d), a p-type impurity is selectively implanted into the slanted portion of the first semiconductor layer and the slanted portion of the second semiconductor layer, using the third mask film as a mask.

19. The method of manufacturing a semiconductor device according to claim 12, wherein, when viewed from a normal direction to the plane of the substrate, the first semiconductor layer has a first neck portion located between the first source region and the first drain region, and the second semiconductor layer has a second neck portion located between the second source region and the second drain region, and wherein the slanted portion of the first semiconductor layer is included in the first neck portion, and the slanted portion of the second semiconductor layer is included in the second neck portion.

\* \* \* \* \*